(12) United States Patent
Sakakibara et al.

(10) Patent No.: US 9,164,387 B2
(45) Date of Patent: Oct. 20, 2015

(54) PATTERN-FORMING METHOD, AND RADIATION-SENSITIVE RESIN COMPOSITION

(71) Applicant: JSR CORPORATION, Tokyo (JP)

(72) Inventors: Hirokazu Sakakibara, Tokyo (JP); Masafumi Hori, Tokyo (JP); Koji Ito, Tokyo (JP); Reiko Kimura, Tokyo (JP); Taiichi Furukawa, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 13/855,749

(22) Filed: Apr. 3, 2013

(65) Prior Publication Data

US 2013/0224661 A1    Aug. 29, 2013

Related U.S. Application Data

(63) Continuation of application No. PCT/JP2011/072296, filed on Sep. 28, 2011.

(30) Foreign Application Priority Data

Oct. 4, 2010    (JP) .................................. 2010-225259

(51) Int. Cl.
| | |
|---|---|
| *G03F 7/004* | (2006.01) |
| *G03F 7/20* | (2006.01) |
| *C08F 20/28* | (2006.01) |
| *G03F 7/039* | (2006.01) |
| *G03F 7/11* | (2006.01) |
| *G03F 7/32* | (2006.01) |
| *C08F 220/28* | (2006.01) |

(52) U.S. Cl.
CPC . *G03F 7/20* (2013.01); *C08F 20/28* (2013.01); *G03F 7/004* (2013.01); *G03F 7/0046* (2013.01); *G03F 7/0397* (2013.01); *G03F 7/11* (2013.01); *G03F 7/2041* (2013.01); *G03F 7/325* (2013.01); *C08F 2220/283* (2013.01)

(58) Field of Classification Search
CPC ................................. G03F 7/004; G03F 7/027
See application file for complete search history.

(56) References Cited

U.S. PATENT DOCUMENTS

| | | | |
|---|---|---|---|
| 4,910,122 A | 3/1990 | Arnold et al. | |
| 7,569,326 B2 | 8/2009 | Ohsawa et al. | |
| 2004/0072094 A1 | 4/2004 | Shima et al. | |
| 2006/0234154 A1 | 10/2006 | Nishimura et al. | |
| 2008/0187860 A1 | 8/2008 | Tsubaki et al. | |
| 2009/0269696 A1 | 10/2009 | Ohsawa et al. | |
| 2011/0177462 A1 | 7/2011 | Hatakeyama et al. | |
| 2011/0294069 A1* | 12/2011 | Bae et al. .................. | 430/283.1 |
| 2012/0009527 A1 | 1/2012 | Hatakeyama et al. | |
| 2013/0164695 A1 | 6/2013 | Nishimura et al. | |

FOREIGN PATENT DOCUMENTS

| | | |
|---|---|---|
| JP | 06-12452 B2 | 5/1984 |
| JP | 59-93448 | 5/1984 |
| JP | 05-188598 | 7/1993 |
| JP | 2000-199953 | 7/2000 |
| JP | 2002-525683 | 8/2002 |
| JP | 2003-043678 A | 2/2003 |
| JP | 3869306 B2 | 5/2003 |
| JP | 2005-352384 | 12/2005 |
| JP | 2008-058538 | 3/2008 |
| JP | 2008-281974 | 11/2008 |
| JP | 2008-292975 | 12/2008 |
| JP | 2009-025707 | 2/2009 |
| JP | 2009-025708 | 2/2009 |
| JP | 2009-025723 | 2/2009 |
| JP | 2009-211051 | 9/2009 |
| JP | 2009-258585 | 11/2009 |
| JP | 2009-258586 | 11/2009 |
| JP | 2010-024330 | 2/2010 |
| JP | 2010-039476 A | 2/2010 |
| JP | 2010-066503 | 3/2010 |
| JP | 2010-139996 | 6/2010 |
| JP | 2010-152349 A | 7/2010 |
| JP | 2010-152353 | 7/2010 |
| JP | 2011-203644 | 10/2011 |
| JP | 2011-209520 A | 10/2011 |
| JP | 2011-221501 A | 11/2011 |
| JP | 2011-221513 | 11/2011 |
| JP | 2012-027438 A | 2/2012 |
| JP | 2012-153874 A | 8/2012 |
| TW | 200839467 A | 10/2008 |

(Continued)

OTHER PUBLICATIONS

International Search Report for corresponding International Application No. PCT/JP2011/072296, Oct. 25, 2011.
Lee et al., "Double exposure technology using silicon containing materials", SPIE, 2006, vol. 6153, pp. 1-7.
Nishikubo et al., "Convenient Syntheses of Cyclic Carbonates by new Reaction of Oxtranes with β-Butyrolactone", Tetrahedron Letters, pp. 3741-3744, vol. 27, No. 32, 1986.
Calo et al., "Cyclic Carbonate Formation from Carbon Dioxide and Oxiranes in Tetrabutylammonium Halides as Solvents and Catalysts", Organic Letters, 2002, pp. 2561-2563, vol. 4, No. 15.
International Search Report for corresponding International Application No. PCT/JP2011/056120, Jun. 7, 2011.
International Search Report for corresponding International Application No. PCT/JP2011/073974, Dec. 20, 2011.

(Continued)

*Primary Examiner* — Daborah Chacko Davis
(74) *Attorney, Agent, or Firm* — Oblon, McClelland, Maier & Neustadt, L.L.P.

(57) ABSTRACT

A pattern-forming method includes coating a radiation-sensitive resin composition on a substrate to provide a resist film. The resist film is exposed. The exposed resist film is developed. A developer solution used in developing the exposed resist film includes no less than 80% by mass of an organic solvent. The radiation-sensitive resin composition includes a first polymer and a radiation-sensitive acid generator. The first polymer includes a first structural unit having an acid-labile group and an alicyclic group. The alicyclic group is capable of avoiding dissociation from a molecular chain by an action of an acid.

12 Claims, No Drawings

(56) References Cited

FOREIGN PATENT DOCUMENTS

| WO | WO 2004/068242 | 8/2004 |
|---|---|---|
| WO | WO 2007/116664 | 10/2007 |
| WO | WO 2008/153109 | 12/2008 |
| WO | WO 2008/153110 | 12/2008 |
| WO | WO 2010/007993 | 1/2010 |
| WO | WO 2010/119910 | 10/2010 |

OTHER PUBLICATIONS

International Search Report for corresponding International Application No. PCT/JP2011/070197, Oct. 11, 2011.
United States Office Action for corresponding U.S. Appl. No. 13/861,416, Sep. 9, 2013.
Office Action issued by the U.S. Patent and Trademark Office for the U.S. Appl. No. 13/861,416, Jan. 10, 2014.
Japanese Office Action for corresponding JP Application No. 2011-043032, Apr. 8, 2014.
Office Action mailed Sep. 29, 2014, in co-pending U.S. Appl. No. 14/307,296.
Office Action mailed Jul. 17, 2014, in co-pending U.S. Appl. No. 13/866,093.
Office Action issued Aug. 26, 2014 in Japanese Patent Application No. 2012-537652 (with English language translation).
Office Action issued Aug. 5, 2014 in corresponding Japanese Patent Application No. 2012-538604, and English translation thereof.
Office Action issued Dec. 2, 2014, in Japanese Patent Application No. 2012-538604 (w/ English-language Translation).
Office Action issued Mar. 3, 2015, in Japanese Patent Application No. 2012-539740 (w/ English translation).
Office Action mailed May 7, 2015, in co-pending U.S. Appl. No. 14/640,882.
Office Action issued May 12, 2015, Taiwan Patent Application No. 100137128 filed Oct. 13, 2011.
Office Action issued May 21, 2015, in Taiwan Patent Application No. 100138099 filed Oct. 20, 2011 (w/ English translation).
Office Action mailed Jun. 16, 2015, in related U.S. Appl. No. 14/640,882.
OMNOVA SOLUTIONS INC., PolyFox PF-636, PF-636, PF-656, PF-6320 & PF-6520, [online], Jun. 2009.
Japanese Office Action mailed Aug. 25, 2012, in Japanese Patent Application No. 2012-539740 with English Translation thereof.

* cited by examiner

PATTERN-FORMING METHOD, AND RADIATION-SENSITIVE RESIN COMPOSITION

CROSS-REFERENCE TO RELATED APPLICATIONS

The present application is a continuation application of International Application No. PCT/JP2011/072296, filed Sep. 28, 2011, which claims priority to Japanese Patent Application No. 2010-225259, filed Oct. 4, 2010. The contents of these applications are incorporated herein by reference in their entirety.

BACKGROUND OF THE INVENTION

1. Field of the Invention

The present invention relates to a pattern-forming method, and a radiation-sensitive resin composition.

2. Discussion of the Background

Miniaturization of structures in various types of electronic devices such as semiconductor devices and liquid crystal devices has been accompanied by demands for miniaturization of resist patterns in lithography processes. Although fine resist patterns having a line width of about 90 nm can be formed using, for example, an ArF excimer laser at present, finer pattern formation is required in the future.

Therefore, pattern-forming methods involving resist compositions, developer solutions, exposure methods and the like have been improved. For example, high resolving abilities can be reportedly attained according to liquid immersion lithography, even if a light source of the same exposure wavelength is employed, similarly to the case in which a light source of a shorter wavelength is employed. Such liquid immersion lithography has drawn attention as a technique that achieves high resolution in manufacturing semiconductor elements which require a large amount of investment in equipment while suppressing an increase in costs.

However, due to elution of substances included in a resist into a liquid immersion medium, and the like in liquid immersion lithography, disadvantages have been suggested that adversely affect lithography characteristics by way of: deterioration of the resist film to impair performances thereof; regional changes of a refractive index of the liquid immersion medium due to eluted substances; contamination of the surface of a lens from eluted substances; and the like (see pamphlet of PCT International Publication No. 04/068242).

In addition, as a technique for increasing resolving power utilizing characteristic features of chemically amplified type resist materials, a technique in which a developer solution is used which is an organic solvent having lower polarity than that of aqueous alkali solutions has been investigated (see Japanese Unexamined Patent Application, Publication No. 2000-199953).

SUMMARY OF THE INVENTION

According to one aspect of the present invention, a pattern-forming method includes coating a radiation-sensitive resin composition on a substrate to provide a resist film. The resist film is exposed. The exposed resist film is developed. A developer solution used in developing the exposed resist film includes no less than 80% by mass of an organic solvent. The radiation-sensitive resin composition includes a first polymer and a radiation-sensitive acid generator. The first polymer includes a first structural unit having an acid-labile group and an alicyclic group. The alicyclic group is capable of avoiding dissociation from a molecular chain by an action of an acid.

According to another aspect of the present invention, a radiation-sensitive resin composition includes a first polymer and a radiation-sensitive acid generator. The first polymer includes a first structural unit having an acid-labile group and an alicyclic group. The alicyclic group is capable of avoiding dissociation from a molecular chain by an action of an acid. The radiation-sensitive resin composition is for use in pattern-forming method including coating a radiation-sensitive resin composition on a substrate to provide a resist film, exposing the resist film, and developing the exposed resist film. A developer solution used in developing the exposed resist film includes no less than 80% by mass of an organic solvent.

DESCRIPTION OF THE EMBODIMENTS

According to an embodiment of the present invention which was made for solving the foregoing problems, a pattern-forming method includes:

(1) a resist film-providing step in which a radiation-sensitive resin composition is coated on a substrate;
(2) an exposure step; and
(3) a development step, wherein
a developer solution used in the development step (3) contains no less than 80% by mass of an organic solvent, and
the radiation-sensitive resin composition includes:
(A) a polymer (hereinafter, may be also referred to as "polymer (A)") that includes (I) a structural unit having an acid-labile group and an alicyclic group, the alicyclic group being capable of avoiding dissociation from the molecular chain by an action of an acid; and
(B) a radiation-sensitive acid generator (hereinafter, may be also referred to as "acid generator (B)").

The polymer (A) of the radiation-sensitive resin composition for use in the pattern-forming method includes (I) a structural unit having an acid-labile group and an alicyclic group, the alicyclic group being capable of avoiding dissociation from the molecular chain by an action of an acid. Thus, an alicyclic skeleton having a high content of carbon atoms remaining in the polymer even after the acid-labile group was dissociated by an action of an acid, whereby a resist film that is superior in etching resistance can be provided.

The polymer (A) preferably has the structural unit (I) represented by the following formula (1):

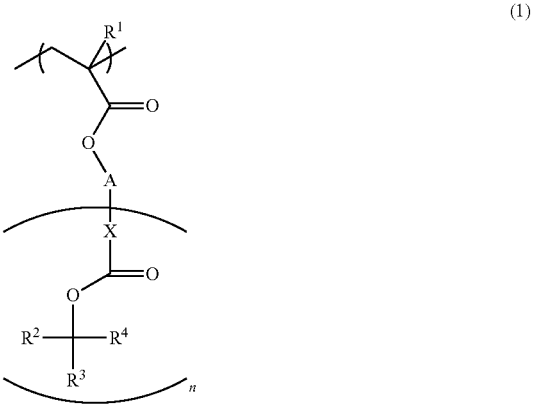

wherein, in the formula (1), $R^1$ represents a hydrogen atom, a methyl group, or a trifluoromethyl group; $R^2$ to $R^4$ each independently represent a linear or branched alkyl group having 1 to 20 carbon atoms or a cycloalkyl group having 3 to 20 carbon atoms, or $R^3$ and $R^4$ taken together represent a ring together with the carbon atom to which $R^3$ and $R^4$ bond; A represents not an acid-labile group but an alicyclic group having 3 to 20 carbon atoms and having a valency of (n+1); X represents a single bond, an alkylene group having 1 to 20 carbon atoms or an oxyalkylene group having 1 to 20 carbon atoms; and n is an integer of 1 to 3, wherein in a case where n is 2 or greater, a plurality of $R^2$s are each identical or different, a plurality of $R^3$s are each identical or different and a plurality of $R^4$s are each identical or different.

Due to having the above-specified structure, the alicyclic group in the polymer (A) is positioned in the vicinity of the polymer molecular chain; therefore, etching resistance of the resist film provided using the radiation-sensitive resin composition for use in the pattern-forming method is improved. In addition, the monomer that gives such a structural unit can be easily synthesized, and is superior in copolymerizability. Moreover, the proportion of such a structural unit contained can be increased, and as a result, etching resistance of the resultant resist film can be further improved.

"A" in the above formula (1) is preferably a group derived from adamantane or norbornane by removing 2 to 4 hydrogen atoms. When the polymer (A) has the alicyclic group derived from adamantane or norbornane by removing 2 to 4 hydrogen atoms in addition to the acid-labile group, a structure having a high carbon content remains after the acid-labile group is dissociated by an action of an acid, and thus the resultant has superior etching resistance. On the other hand, when the content of carbon atoms is too high, to impart sufficient contrast of dissolution between light-exposed sites and light-unexposed sites may be difficult due to too high solubility of the polymer (A) in developer solutions. However, when A is the group having the aforementioned structure, such disadvantages are less likely to occur.

It is preferred that the radiation-sensitive resin composition further contains (C) a polymer having a higher content of fluorine atoms than that of the polymer (A) (hereinafter, may be also referred to as "polymer (C)"). When the radiation-sensitive resin composition for use in the pattern-forming method contains the polymer (C), in forming a resist film, the polymer (C) tends to be unevenly distributed in the vicinity of the surface of the resist film due to low surface free energy, i.e., a characteristic feature of the polymer (C) in the film. Thus, containing the polymer (C) is preferred since elution of an acid generating agent, an acid diffusion control agent and the like into a liquid immersion medium can be prevented during liquid immersion lithography. In addition, owing to a water repellent feature of the polymer (C), an advancing contact angle of a liquid immersion medium on a resist film can be controlled to fall within a desired range, whereby formation of bubble defects can be suppressed. Furthermore, a higher receding contact angle of a liquid immersion medium on a resist film is attained, thereby enabling exposure by high-speed scanning without remaining water droplets.

It is preferred that the pattern-forming method further includes an etching step. Since the resist film provided using the radiation-sensitive resin composition has superior etching resistance, pattern that is superior in lithography characteristics can be formed.

The radiation-sensitive resin composition according to the embodiment of the present invention is for use in a pattern-forming method including:

(1) a resist film-providing step in which a radiation-sensitive resin composition is coated on a substrate;
(2) an exposure step; and
(3) a development step, wherein
a developer solution used in the development step (3) contains no less than 80% by mass of an organic solvent, and the radiation-sensitive resin composition includes:
(A) a polymer that includes (I) a structural unit having an acid-labile group and an alicyclic group, the alicyclic group being capable of avoiding dissociation from the molecular chain by an action of an acid; and
(B) a radiation-sensitive acid generator.

According to the embodiment of the radiation-sensitive resin composition, a resist film that is superior in etching resistance can be provided.

According to the pattern-forming method of an embodiment of the present invention, a resist film that is superior in general characteristics of resist films such as sensitivity and resolving ability and has further improved etching resistance can be provided, and formation of a pattern that is superior in lithography characteristics is enabled. The embodiments will now be described in detail.

Pattern-Forming Method

According to the embodiment of the present invention, a pattern-forming method includes (1) a resist film-providing step in which a radiation-sensitive resin composition is coated on a substrate; (2) an exposure step; and (3) a development step, in which a developer solution used in the (3) development step contains no less than 80% by mass of an organic solvent, and the radiation-sensitive resin composition contains (A) a polymer, and (B) an acid generator. Furthermore, the pattern-forming method preferably includes (4) an etching step. Hereinafter, each step will be described in detail. It is to be noted that although an exposure process in the exposure step (2) of the pattern-forming method is not particularly limited, each step in a case in which a liquid immersion lithography method is employed will be explained below since liquid immersion lithography is preferably used in the embodiment of the present invention.

Step (1)

In this step, the composition used in the embodiment of the present invention is coated directly or via an underlayer film, etc., on a substrate to provide a resist film. As the substrate, for example, conventionally well-known substrates such as a silicon wafer and a wafer coated with aluminum can be used. In addition, organic or inorganic antireflective films disclosed in, for example, Japanese Examined Patent Application, Publication No. H06-12452, Japanese Unexamined Patent Application, Publication No. S59-93448, and the like may be provided on the substrate. The underlayer film, etc., is not particularly limit, and a material that is insoluble in a developer solution used upon development after the exposure, and that can be etched by a conventional etching method may be employed. For example, one which has been generally employed as a base material in manufacturing semiconductor elements as well as liquid crystal display elements may be used.

A coating method of the radiation-sensitive resin composition is exemplified by spin-coating, cast coating, roll coating, and the like. It is to be noted that the film thickness of the resist film provided is typically 0.01 μm to 1 μm, and preferably 0.01 μm to 0.5 μm.

After coating the radiation-sensitive resin composition, a solvent in the coating film may be volatilized as needed by prebaking (PB). According to heating conditions of PB, the temperature may be appropriately selected depending on the formulation of the photoresist composition, and is typically about 30° C. to 200° C. and preferably 50° C. to 150° C.

A protective film as disclosed in Japanese Unexamined Patent Application, Publication No. H05-188598 or the like may be provided on the resist film so that the resist film is not affected by basic impurities and the like contained in the environmental atmosphere. Furthermore, in order to prevent outflow of the acid generating agent and the like from the resist layer, a liquid immersion lithography protective film as disclosed in Japanese Unexamined Patent Application, Publication No. 2005-352384 or the like may be provided on the resist film. These techniques may be used in combination.

Step (2)

In this step, the resist film provided in the step (1) is exposed at a desired region by carrying out reduction projection through a mask having a specific pattern such as a dot pattern or a line pattern, and an immersion liquid. For example, a trench pattern can be formed by carrying out reduced projection exposure at a desired region through a mask having an isolated line (iso-line) pattern. Also, the exposure may be carried out at least twice depending on the desired pattern and the mask pattern. When the exposure is carried out at least twice, the exposure is preferably carried out continuously. When the exposure is carried out a plurality of times, for example, first reduced projection exposure is carried out through a line-and-space pattern mask at a desired region, and subsequently second reduced projection exposure is carried out such that lines cross over light-exposed sites subjected to the first exposure. The first light-exposed sites are preferably orthogonal to the second light-exposed sites. Due to being orthogonal with each other, a circular contact hole pattern can be easily formed at light-unexposed sites surrounded by light-exposed sites. It is to be noted that, examples of the immersion liquid for use in the exposure include water, a fluorine-containing inert liquid, and the like. It is preferred that the immersion liquid be transparent to the exposure wavelength, and has a temperature coefficient of the refractive index as small as possible so that distortion of an optical image projected onto the film is minimized. When using an ArF excimer laser (wavelength: 193 nm) as the exposure light source, it is preferred to use water from the viewpoint of availability and ease of handling, in addition to the viewpoints described above.

A radioactive ray used for the exposure is appropriately selected in accordance with the type of the acid generator (B), and is exemplified by an ultraviolet ray, a far ultraviolet ray, an X-ray, a charged particle ray, and the like. Among these, a far ultraviolet ray typified by an ArF excimer laser or a KrF excimer laser (wavelength: 248 nm) is preferred, and an ArF excimer laser is more preferred. The exposure conditions such as an exposure dose are appropriately selected in accordance with the formulation, and type of additives etc. of the composition. The pattern-forming method of the embodiment of the present invention may include a plurality of the exposure steps, and light sources employed in the exposure carried out a plurality of times may be identical or different, but an ArF excimer laser beam is preferably used in the first exposure.

In addition, it is preferred that post-exposure baking (PEB) is carried out after the exposure. When the PEB is carried out, a dissociation reaction of an acid-labile group in the composition can smoothly proceed. According to heating conditions of PEB, the temperature may be typically 30° C. to 200° C., and preferably 50° C. to 170° C.

Step (3)

In this step, after the exposure in the step (2), development is carried out using a negative developer solution containing an organic solvent to form a pattern such as a trench pattern and/or a hole pattern. The negative developer solution as referred to means a developer solution that selectively dissolve and remove poorly light-exposed sites and light-unexposed sites. The organic solvent contained in the negative developer solution is preferably at least one selected from the group consisting of an alcohol solvent, an ether solvent, a ketone organic solvent, an amide solvent, an ester organic solvent and a hydrocarbon solvent.

Examples of the alcohol solvent include:
monohydric alcohol solvents such as methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;
polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-n ethyl-1,3-hexanediol, diethylene glycol, dipropylene glycol, triethylene glycol and tripropylene glycol;
partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ether solvent include diethyl ether, dipropyl ether, dibutyl ether, diphenyl ether, and the like.

Examples of the ketone solvent include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, di-isobutyl ketone, trimethylnonanone, cyclopentanone, cyclohexanone, cycloheptanone, cyclooctanone, methylcyclohexanone, 2,4-pentanedione, acetonyl acetone, acetophenone, and the like.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvent include:
aliphatic hydrocarbon solvents such as n-pentane, i-pentane, n-hexane, i-hexane, n-heptane, i-heptane, 2,2,4-trimethyl pentane, n-octane, i-octane, cyclohexane and methylcyclohexane;
aromatic hydrocarbon solvents such as benzene, toluene, xylene, mesitylene, ethylbenzene, trimethylbenzene, methylethylbenzene, n-propylbenzene, i-propylbenzene, diethylbenzene, i-butylbenzene, triethylbenzene, di-1-propylbenzene and n-amylnaphthalene, and the like.

Of these, n-butyl acetate, i-propyl acetate, n-pentyl acetate, methyl ethyl ketone, methyl-n-butyl ketone, and methyl-n-pentyl ketone are preferred. These organic solvents may be used either alone, or in combination of two or more thereof.

The content of the organic solvent in the developer solution is no less than 80% by mass, preferably no less than 90% by mass, and most preferably no less than 99% by mass. When the developer solution contains no less than 80% by mass of the organic solvent, favorable development characteristics can be attained, and a pattern that is further superior in lithography characteristics can be formed. It should be noted that components other than the organic solvent are exemplified by water, a silicone oil, a surfactant, and the like.

A surfactant may be added to the developer solution in an appropriate amount as needed. As the surfactant, for example, an ionic or nonionic fluorochemical surfactant and/or a silicone surfactant, and the like may be used.

Examples of the development method include a dipping method that immerses the substrate in a container filled with the developer for a given time, a puddle method that allows the developer to be present on the surface of the substrate due to surface tension for a given time, a spraying method that sprays the developer onto the surface of the substrate, a dynamic dispensing method that applies the developer to the substrate that is rotated at a constant speed while scanning with a developer application nozzle at a constant speed, and the like.

In the pattern-forming method, a step of rinsing the resist film with a rinse agent may be carried out after the development in the step (3). As the rinse agent, a liquid containing an organic solvent is preferably used similarly to the developer solution, whereby scum generated can be efficiently washed away. The rinse agent is preferably a hydrocarbon solvent, a ketone solvent, an ester solvent, an alcohol solvent, an amide solvent, or the like. Of these, an alcohol solvent and an ester solvent are preferred, and a monovalent alcohol solvent having 6 to 8 carbon atoms is more preferred. The monovalent alcohol having 6 to 8 carbon atoms is exemplified linear, branched or cyclic monovalent alcohols, and examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol, and 4-methyl-2-pentanol are preferred.

Each component of the rinse agent may be used either alone, or in combination of two or more thereof. The moisture content of the rinse agent is preferably no greater than 10% by mass, more preferably no greater than 5% by mass, and particularly preferably no greater than 3% by mass. When the moisture content is no greater than 10% by mass, favorable development characteristics can be attained. It is to be noted that, a surfactant described later may be added to the rinse agent.

Examples of the rinsing method include a spinning method that applies the rinse agent to the substrate that is rotated at a constant speed, a dipping method that immerses the substrate in a container filled with the rinse agent for a given time, a spraying method that sprays the rinse agent onto the surface of the substrate, and the like.

Step (4)

The method for etching is not particularly limited. For example, any of well-known methods, i.e., chemical etching such as down flow etching and chemical dry etching, physical etching such as sputter etching and ion beam etching, chemical and physical etching such as plasma and/or reactive ion etching, and the like may be employed. Among these, plasma and/or reactive ion etching is preferred.

A gas used in the plasma and/or reactive ion etching is not particularly limited as long as it is a gas usually used in the field of dry etching. Examples of the gas include oxygen, halogen, sulfur dioxide, and the like. In light of high resolution of the resultant pattern, and versatility, a plasma and/or reactive ion including oxygen is preferably used.

Most common dry etching may involve parallel plate type RIE. In this method, the layered product having the resist pattern formed thereon is first placed in a chamber of an RIE apparatus, and a necessary etching gas is introduced. When a high-frequency voltage is applied to the holder of the resist layered product placed parallel to the upper electrode in the chamber, the gas is turned into the plasma. In the plasma, charged particles such as positive/negative ions and electrons, as well as neutral active species are present as the etching species. When these etching species are adsorbed on the object to be etched, a chemical reaction is caused, whereby the reaction products are detached from the surface and discharged outside, leading to progress of the etching.

Radiation-Sensitive Resin Composition

The radiation-sensitive resin composition for use in the embodiment of the present invention contains (A) a polymer, and (B) an acid generator. Furthermore, (C) a polymer is preferably contained. In addition, optional components may be contained as long as the effects of the embodiment of the present invention are not impaired. Hereinafter, each component will be described in detail.

(A) Polymer

The polymer (A) includes a structural unit (I) having an acid-labile group and an alicyclic group, and the alicyclic group is resistant to dissociation from the molecular chain by an action of an acid. It is to be noted that the "acid-labile group" means a group that substitutes for a hydrogen atom in a polar functional group, and is dissociated by an action of an acid generated from the acid generator (B) upon exposure. Also, "the alicyclic group being capable of avoiding dissociation from the molecular chain by an action of an acid" means that the alicyclic group represented by "A" in the above formula (1) is included in the polymer even after the acid acted on the polymer. The acid-labile group included in the polymer (A) is dissociated by an action of an acid generated from the acid generator (B) upon exposure, leading to an increase in the polarity of the polymer, whereby solubility in the developer solution of the polymer (A) in light-exposed sites is decreased. Furthermore, since the polymer (A) has the alicyclic group being capable of avoiding dissociation from the molecular chain by an action of an acid, a high carbon content is maintained also after the acid-labile group was dissociated, and the resultant resist film has superior etching resistance. The phrase "being capable of avoiding dissociation by an action of an acid" as referred to herein has the same meaning as 'not having properties of the "acid-labile group"', and means that dissociation due to an action of an acid generated from the acid generator (B) upon exposure can be avoided.

The polymer (A) preferably has a structural unit (I) represented by the above formula (1), and may further have "other structural unit" excluding the structural unit (I). Each structural unit will be described in detail below.

Structural Unit (I)

The structural unit (I) is represented by the above formula (1).

In the formula (1), $R^1$ represents a hydrogen atom, a methyl group or a trifluoromethyl group; $R^2$ to $R^4$ each independently represent a linear or branched alkyl group having 1 to 20 carbon atoms or a cycloalkyl group having 3 to 20 carbon atoms, or $R^3$ and $R^4$ taken together represent a ring together with the carbon atom to which $R^3$ and $R^4$ bond; A represents not an acid-labile group but an alicyclic group having 3 to 20 carbon atoms and having a valency of (n+1); X represents a single bond, an alkanediyl group having 1 to 20 carbon atoms or an oxyalkanediyl group having 1 to 20 carbon atoms; n is an integer of 1 to 3, wherein in a case where n is 2 or greater, a plurality of $R^2$s are each identical or different, a plurality of $R^3$s are each identical or different and a plurality of $R^4$s are each identical or different.

Examples of the linear or branched alkyl group having 1 to 20 carbon atoms represented by $R^2$ to $R^4$ include a formethyl group, an ethyl group, a n-propyl group, an i-propyl group, a n-butyl group, an i-butyl group, a n-pentyl group, an i-pentyl group, a n-hexyl group, an i-hexyl group, a n-heptyl group, an i-heptyl group, a n-octyl group, an i-octyl group, a n-nonyl group, an i-nonyl group, a n-decyl group, an i-decyl group, a n-lauryl group, an i-lauryl group, a n-dodecyl group, an i-dodecyl group, a n-tridecyl group, a n-tetradecyl group, a n-pentadecyl group, a n-hexadecyl group, a n-heptadecyl group, a n-octadecyl group, a n-nonadecyl group, a n-eicosyl group, and the like. Of these, a methyl group, an ethyl group, a n-propyl group and a n-butyl group are preferred, and a methyl group or an ethyl group is particularly preferred.

Examples of the cycloalkyl group having 3 to 20 carbon atoms represented by $R^2$ to $R^4$ include:

monocyclic cycloalkyl groups having a cycloalkane skeleton such as a cyclopentyl group and a cyclohexyl group; and polycyclic cycloalkyl groups such as an adamantyl group and a norbornyl group. Also, these groups are unsubstituted or substituted with, for example, at least one linear, branched or cyclic alkyl group having 1 to 10 carbon atoms.

Of these, it is preferred that: $R^2$ to $R^4$ represent a methyl group; or $R^2$ represents an alkyl group having 1 to 4 carbon atoms, and $R^3$ and $R^4$ taken together represent a divalent group having a cycloalkane skeleton having 4 to 8 carbon atoms together with a carbon atom to which $R^3$ and $R^4$ bond. Examples of the divalent cycloalkane group taken represented by $R^3$ and $R^4$ together with a carbon atom to which $R^3$ and $R^4$ bond include a cyclobutanediyl group, a cyclopentanediyl group, a cyclohexanediyl group, a cycloheptanediyl group, and the like. Also, these groups are unsubstituted or substituted with, for example, at least one linear, branched or cyclic alkyl group having 1 to 10 carbon atoms.

In the above formula (1), A represents not an acid-labile group but an alicyclic group having 3 to 20 carbon atoms and having a valency of (n+1).

Examples of the alicyclic group having 3 to 20 carbon atoms and having a valency of (n+1) include:

monocyclic saturated hydrocarbons such as cyclopropane, cyclobutane, cyclopentane, cyclohexane, cycloheptane, cyclooctane, cyclodecane, methylcyclohexane and ethylcyclohexane;

monocyclic unsaturated hydrocarbons such as cyclobutene, cyclopentene, cyclohexene, cycloheptene, cyclooctene, cyclodecene, cyclopentadiene, cyclohexadiene, cyclooctadiene and cyclodecadiene;

polycyclic saturated hydrocarbons such as bicyclo[2.2.1]heptane, bicyclo[2.2.2]octane, tricyclo[5.2.1.0$^{2,6}$]decane, tricyclo[3.3.1.1$^{3,7}$]decane, tetracyclo[6.2.1.1$^{3,6}$.0$^{2,7}$]dodecane, norbornane and adamantane;

groups derived by removing (n+1) hydrogen atoms from a polycyclic unsaturated hydrocarbon group such as bicyclo[2.2.1]heptene, bicyclo[2.2.2]octene, tricyclo[5.2.1.0$^{2,6}$]decene, tricyclo[3.3.1.1$^{3,7}$]decene and tetracyclo[6.2.1.1$^{3,6}$.0$^{2,7}$]dodecene.

In particular, polycyclic saturated hydrocarbon groups having a bridged skeleton such as adamantane and norbornane, monocyclic saturated hydrocarbon groups having a cycloalkane skeleton such as cyclopentane and cyclohexane are preferred. Particularly, an adamantyl group or a norbornyl group is preferred. Also, these groups are unsubstituted or substituted with, for example, at least one linear, branched or cyclic alkyl group having 1 to 10 carbon atoms.

In the above formula (1), X represents a single bond, an alkanediyl group having 1 to 20 carbon atoms or an oxyalkanediyl group. Examples of the alkanediyl group having 1 to 20 carbon atoms include a methanediyl group, an ethanediyl group, a propanediyl group, an isopropanediyl group, a butanediyl group, an isobutanediyl group, and the like. Examples of the oxyalkanediyl group having 1 to 20 carbon atoms include an oxymethylene group, an oxyethylene group, an oxypropylene group, an isooxypropylene group, an oxybutylene group, an isooxybutylene group, and the like. Of these, a single bond, an oxyethylene group or an oxymethylene group is preferred.

Examples of the structural unit (I) include structural units represented by the following formulae, and the like.

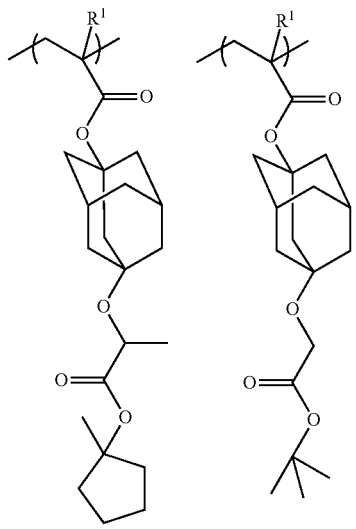

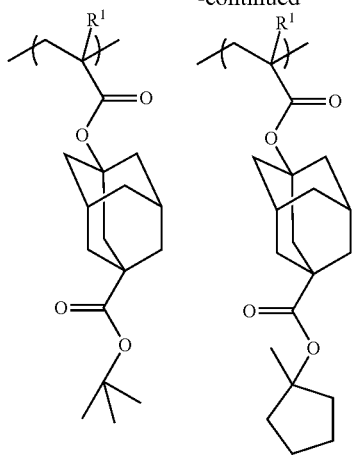
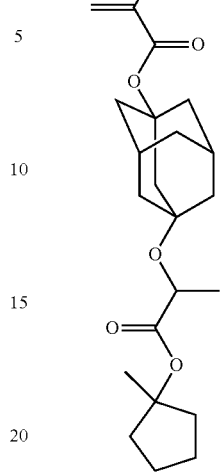
(M-1)
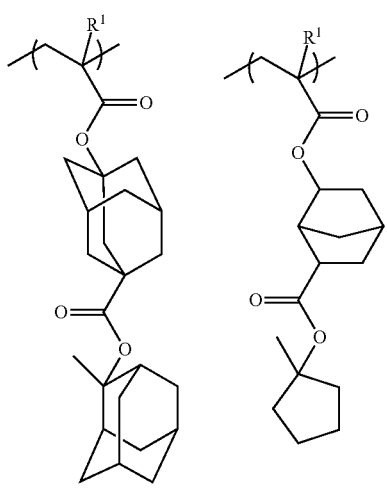
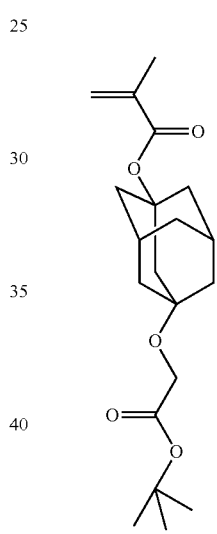
(M-2)
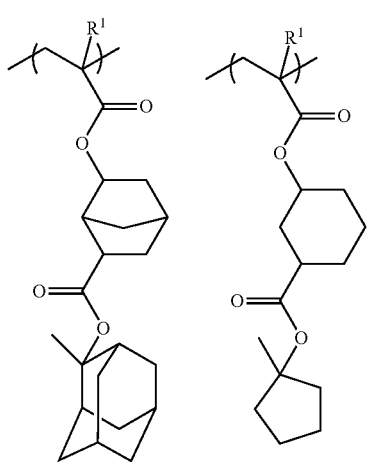
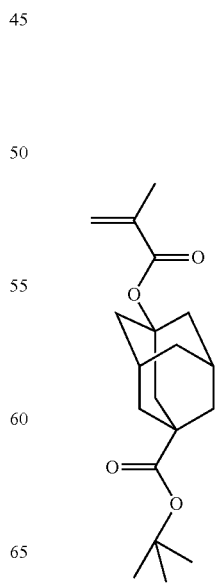
(M-3)
In the above formulae, R¹ is as defined in the above formula (1).
Examples of the monomer that gives the structural unit (I) include monomers represented by the following formulae (M-1) to (M-8), and the like.

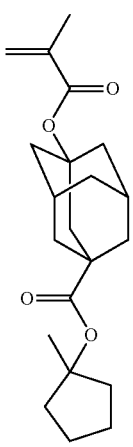

(M-4)

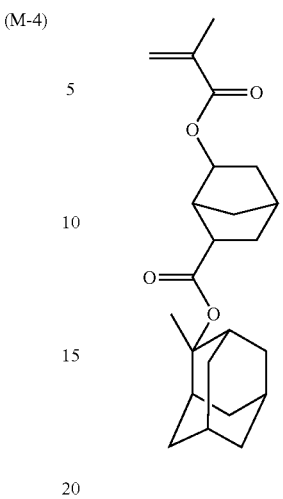

(M-5)

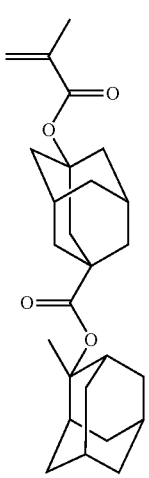

(M-6)

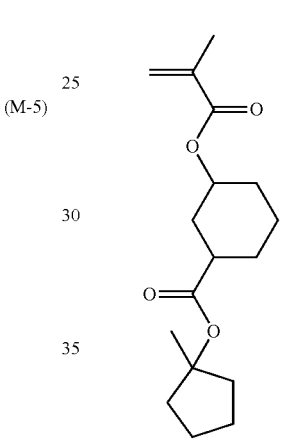

(M-7)

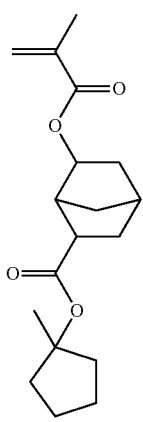

(M-8)

In the polymer (A), the proportion of the total amount of the structural unit (I) contained with respect to the entire structural units constituting the polymer (A) is preferably 10 mol % to 100 mol %, and more preferably 30 mol % to 60 mol % in terms of the total amount of the structural unit (I). It is to be noted that the polymer (A) may include one, or two or more types of the structural unit (I).

Structural Unit (II)

The polymer (A) may have a structural unit (II) represented by the following formula (2).

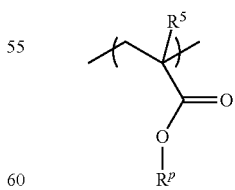

(2)

In the formula (2), $R^5$ represents a hydrogen atom, a methyl group or a trifluoromethyl group; and $R^P$ represents an acid-labile group.

The acid-labile group represented by $R^P$ is preferably a group represented by the following formula (3).

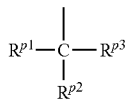
(3)

In the formula (3), $R^{P1}$ represents an alkyl group having 1 to 10 carbon atoms or a monovalent alicyclic group having 3 to 20 carbon atoms; and $R^{p2}$ and $R^{p3}$ each independently represent an alkyl group having 1 to 10 carbon atoms or an alicyclic group having 3 to 20 carbon atoms. It is to be noted that $R^{p2}$ and $R^{p3}$ optionally taken together represent a divalent alicyclic group having 3 to 20 carbon atoms together with the carbon atom to which $R^{p2}$ and $R^{p3}$ each bond.

Examples of the alkyl group having 1 to 10 carbon atoms represented by $R^{p1}$, $R^{p2}$ and $R^{p3}$ include a methyl group, an ethyl group, a n-propyl group, an i-propyl group, a n-butyl group, a 2-methylpropyl group, a 1-methylpropyl group, a t-butyl group, and the like.

Examples of the monovalent alicyclic group having 3 to 20 carbon atoms represented by $R_{p1}$, $R^{p2}$ and $R^{p3}$ include:

polycyclic alicyclic groups having a bridged skeleton such as an adamantane skeleton or a norbornane skeleton; and monocyclic alicyclic groups having a cycloalkane skeleton such as cyclopentane and cyclohexane. Also, these groups are unsubstituted or substituted with, for example, at least one linear, branched or cyclic alkyl group having 1 to 10 carbon atoms.

Of these, it is preferred that $R^{p1}$ represents an alkyl group having 1 to 4 carbon atoms, and $R^{p2}$ and $R^{p3}$ taken together represent a divalent group having an adamantane skeleton or a cycloalkane skeleton together with the carbon atom to which $R^{p2}$ and $R^{p3}$ bond.

Examples of the structural unit (II) include structural units represented by the following formulae (2-1) to (2-4).

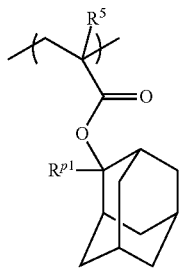
(2-1)

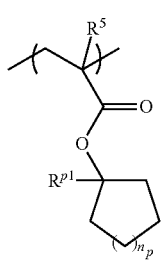
(2-2)

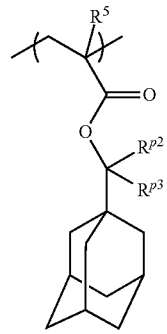
(2-3)

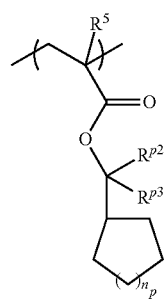
(2-4)

In the formulae (2-1) to (2-4), $R^s$ is as defined in the above formula (2); $R^{p1}$, $R^{p2}$ and $R^{p3}$ are as defined in the above formula (3); and $n_p$ is an integer of 1 to 3.

The structural unit represented by the above formula (2) or (2-1) to (2-4) is exemplified by structural units represented by the following formulae.

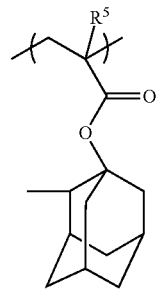 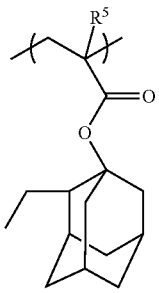 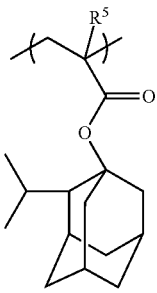

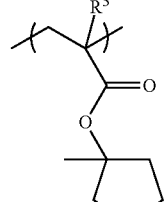 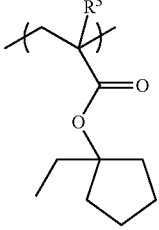 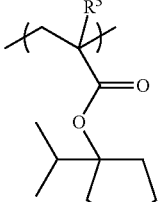

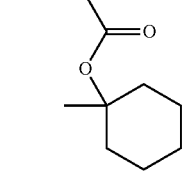 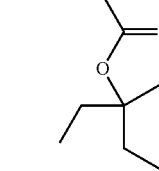

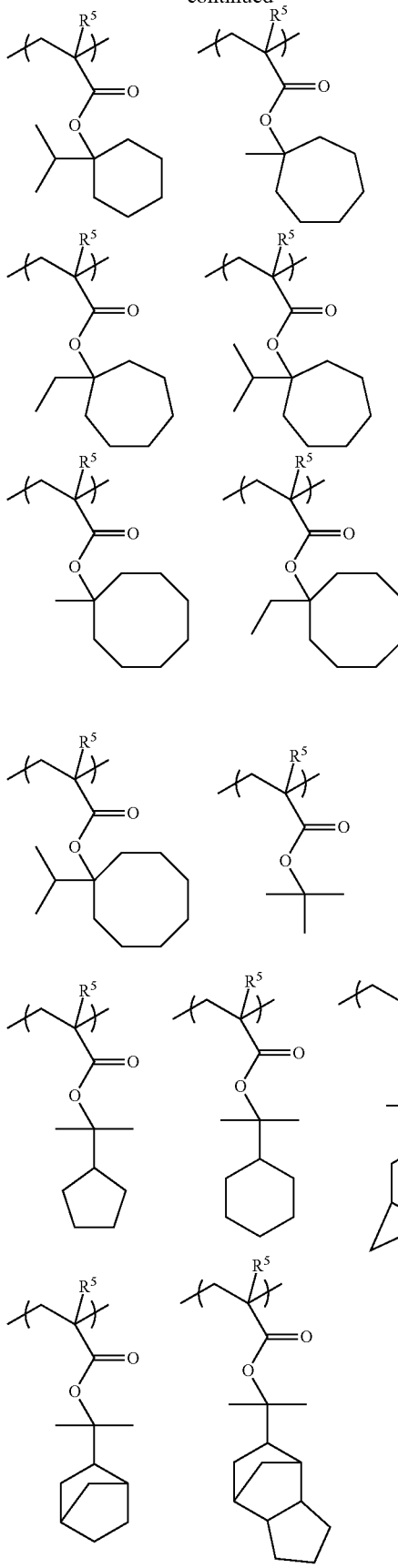

In the formulae, $R^5$ is as defined in the above formula (2).

In the polymer (A), the proportion of the total amount of the structural unit (II) contained with respect to the entire structural units constituting the polymer (A) is typically 0 mol % to 60 mol %, preferably 20 mol % to 60 mol %. It is to be noted that the polymer (A) may include one, or two or more types of the structural unit (II).

Structural Unit (III)

The polymer (A) preferably includes a structural unit (III) having a lactone ring. When the structural unit (III) is included, adhesiveness of the resist film to the substrate can be improved. Herein, the lactone ring indicates one ring that includes a —O—C(O)— structure. The lactone ring is counted as the first ring, and when only the lactone ring is included, the group is referred to as "monocyclic", whereas when other ring structure is further included, the group is referred to as "polycyclic" irrespective of its structure.

Examples of the structural unit (III) include structural units represented by the following formulae.

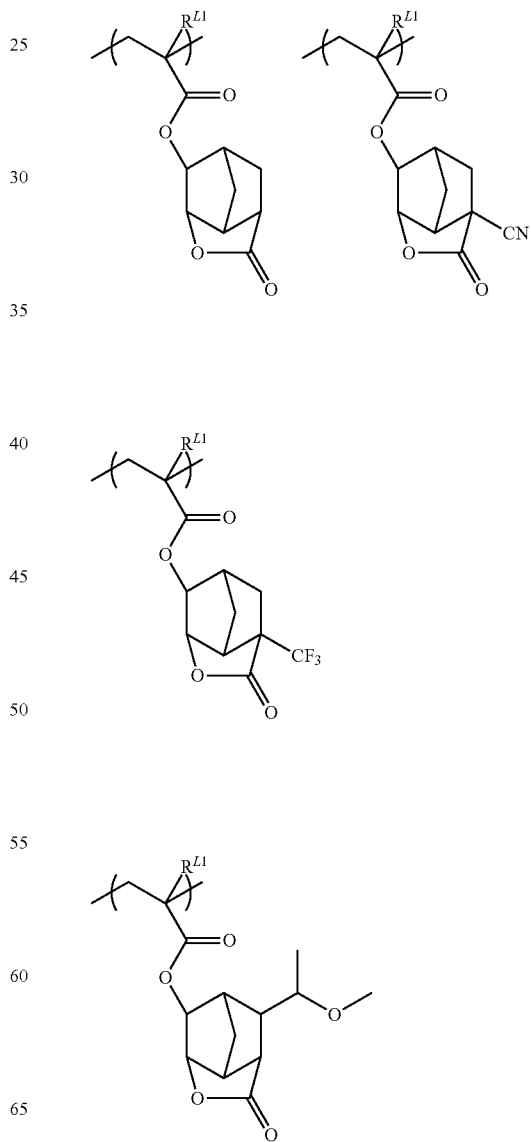

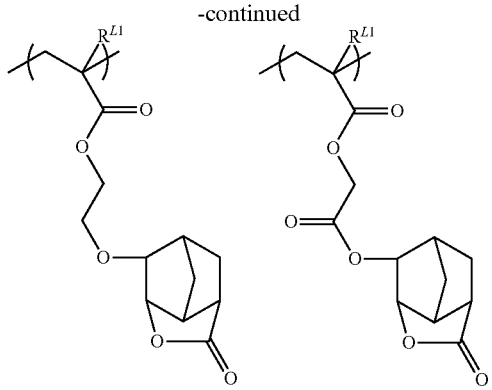
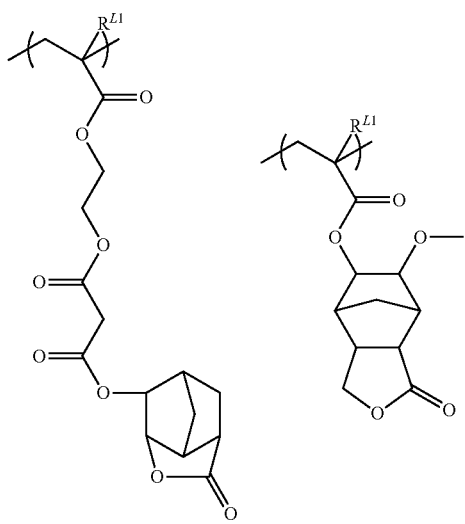

In the formulae, $R^{L1}$ represents a hydrogen atom, a methyl group or a trifluoromethyl group.

A specific example of the monomer that yields the structural unit having a lactone ring is represented by the following formula (L-1).

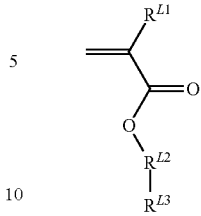

In the formula (L-1), $R^{L1}$ represents a hydrogen atom, a methyl group or a trifluoromethyl group; $R^{L2}$ represents a single bond or a divalent linking group; $R^{L3}$ represents a monovalent organic group having a lactone structure.

The divalent linking group represented by $R^{L2}$ is exemplified by a divalent linear or branched hydrocarbon group having 1 to 20 carbon atoms, and the like.

Examples of the monovalent organic group having a lactone structure represented by $R^{L3}$ include groups represented by the following formulae (L3-1) to (L3-6).

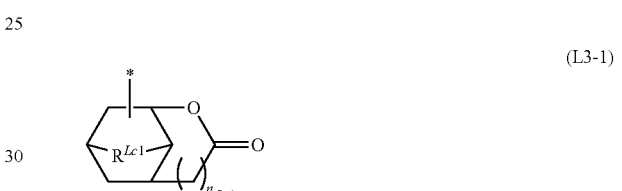

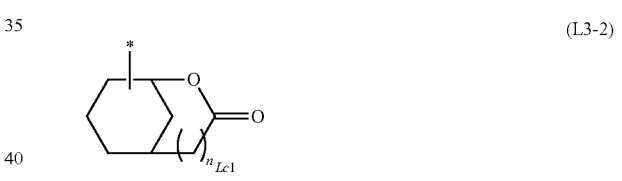

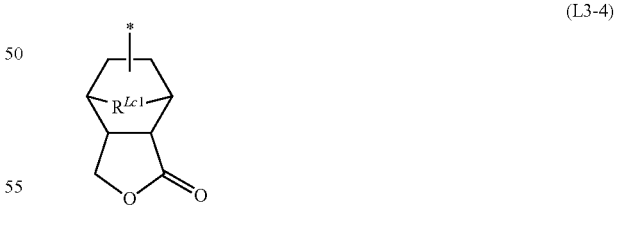

(L3-6)

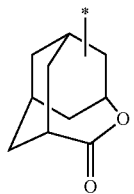

In the formulae (L3-1) to (L3-6), $R_{Lc1}$ represents an oxygen atom or a methylene group; $R^{Lc2}$ represents a hydrogen atom or an alkyl group having 1 to 4 carbon atoms; $n_{Lc1}$ is 0 or 1; $n_{Lc2}$ is an integer of 0 to 3; * denotes an atomic bonding that links to $R^{L2}$ in the above formula (L-1). It is to be noted that groups represented in the formulae (L3-1) to (L3-6) may have a substituent.

Preferable monomers that give the structural unit having the lactone structure include, for example, monomers described in paragraph [0043] of PCT International Publication No. 2007/116664.

In the polymer (A), the proportion of the total amount of the structural unit (III) contained with respect to the entire structural units constituting the polymer (A) is preferably 30 mol % to 80 mol %. It is to be noted that the polymer (A) may include one, or two or more types of the structural unit (III).

Structural Unit (IV)

The polymer (A) may have other structural unit excluding the structural units (I) to (III). The other structural unit can be used for the purpose of regulating a rate of dissolution into developer solutions, imparting etching resistance, and the like. Such other structural unit is exemplified by the structural unit (IV) derived from acrylic acid or methacrylic acid, as well as a polymerizable monomer that includes a hydrocarbon group having a polar group such as a hydroxyl group, a carboxyl group, a cyano group or an amide group. Examples of the structural unit (IV) include groups represented by the following formulae (4-1) to (4-11), and the like.

(4-1)
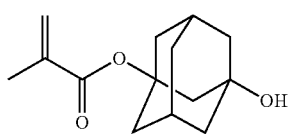

(4-2)
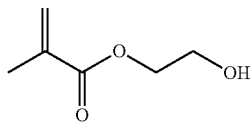

(4-3)
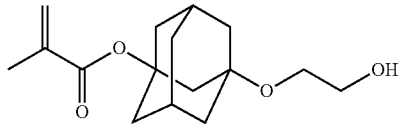

(4-4)
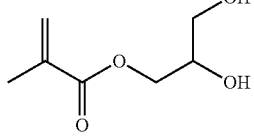

(4-5)
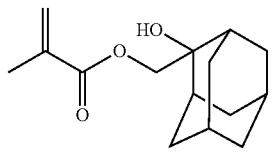

(4-6)
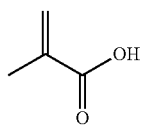

(4-7)
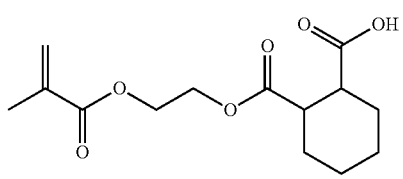

(4-8)
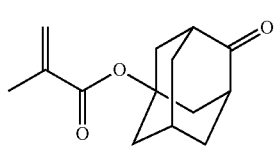

(4-9)
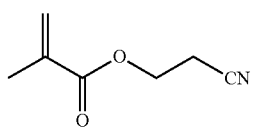

(4-10)
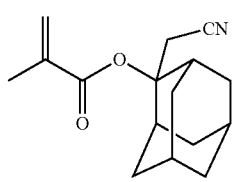

(4-11)
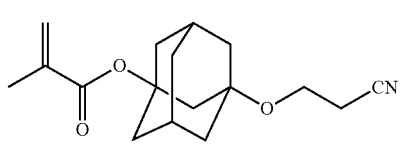

Synthesis Method of Polymer (A)

The polymer (A) may be prepared, for example, by polymerizing the monomer that gives each predetermined structural unit in an appropriate solvent using a radical polymerization initiator.

Examples of the radical initiator for use in the polymerization include azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2-methylpropionitrile), and the like. These initiators may be used as a mixture of two or more thereof.

Examples of solvent for use in the polymerization include:
  alkanes such as n-pentane, n-hexane, n-heptane, n-octane, n-nonane and n-decane;
  cycloalkanes such as cyclohexane, cycloheptane, cyclooctane, decalin and norbornane;
  aromatic hydrocarbons such as benzene, toluene, xylene, ethylbenzene and cumene;
  halogenated hydrocarbons such as chlorobutanes, bromohexanes, dichloroethanes, hexamethylene dibromide and chlorobenzene;

saturated carboxylate esters such as ethyl acetate, n-butyl acetate, i-butyl acetate and methyl propionate;
ketones such as acetone, 2-butanone, 4-methyl-2-pentanone and 2-heptanone;
ethers such as tetrahydrofuran, dimethoxyethanes and diethoxyethanes;
alcohols such as methanol, ethanol, 1-propanol, 2-propanol and 4-methyl-2-pentanol; and the like. These solvents may be used either alone, or in combination of two or more thereof.

The reaction temperature in the polymerization is typically 40° C. to 150° C., and preferably 50° C. to 120° C. The reaction time is typically 1 hour to 48 hrs, and preferably 1 hour to 24 hrs.

The weight average molecular weight (Mw) in terms of the polystyrene equivalent of the polymer (A) as determined by a gel permeation chromatography (GPC) method is preferably 1,000 to 50,000, more preferably 1,000 to 30,000, and particularly preferably 1,000 to 20,000. When the Mw of the polymer (A) is less than 1,000, it is impossible to attain a sufficient advancing contact angle. On the other hand, the Mw of the polymer (A) exceeding 50,000 is likely to result in deteriorated developability of the resultant resist. A ratio (Mw/Mn) of the Mw of the polymer (A) to a number average molecular weight in terms of the polystyrene equivalent (Mn) as determined by a GPC method is typically 1 to 3, and preferably 1 to 2.

(B) Acid Generator

The acid generator (B) generates an acid upon exposure, and the acid allows an acid-labile group present in the polymer (A) to be dissociated, thereby generating an acid. As a result, the polymer (A) becomes hardly soluble in developer solutions. The mode of incorporation of the acid generator (B) into the composition may be a form of being incorporated as a compound as described below, a form of being incorporated as a part of a polymer, or a combination of these two forms.

The acid generating agent (B) is exemplified by an onium salt compound, a sulfonimide compound, a halogen-containing compound, a diazo ketone compound, and the like. Of these acid generating agents (B), onium salt compounds are preferred.

Examples of the onium salt compound include sulfonium salts (including tetrahydrothiophenium salts), iodonium salts, phosphonium salts, diazonium salts, pyridinium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1-difluoroethanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium perfluoro-n-butanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methane sulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)-hexane-1-sulfonate, and the like. Among these, triphenylsulfonium trifluoromethanesulfonate, triphenylsulfonium nonafluoro-n-butanesulfonate, 4-cyclohexylphenyldiphenylsulfonium perfluoro-n-butanesulfonate, triphenylsulfonium 2-bicyclo[2.2.1]hept-2-yl-1,1-difluoroethanesulfonate, and triphenylsulfonium-1,1,2,2-tetrafluoro-6-(1-adamantanecarbonyloxy)-hexane-1-sulfonate are preferred.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-s hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like. Among these tetrahydrothiophenium salts, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate and 1-(3,5-dimethyl-4-hydroxyphenyl)tetrahydrothiophenium nonafluoro-n-butanesulfonate are preferred.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like. Among these iodonium salts, bis(4-t-butylphenyl)iodonium nonafluoro-n-butanesulfonate is preferred.

Examples of the sulfonimide compound include N-(trifluoromethanesulfonyloxy)bicyclo[2.2.1]hept-5-ene-2,3-s dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxylmide, N-(camphorsulfonyloxy)bicyclo[2.2.1]hept-5-ene-2,3-dicarboxylmide, and the like.

Among these sulfonimide compounds, N-(trifluoromethanesulfonyloxy)bicyclo[2.2.1]hept-5-ene-2,3-dicarboxylmide is preferred.

These acid generating agents (B) may be used either alone, or in combination of two or more thereof. The amount of the acid generator (B) employed in the case of the acid generator (B) being the acid generating agent is typically no less than 0.1 parts by mass and no greater than 20 parts by mass, and preferably no less than 0.5 parts by mass and no greater than 15 parts by mass with respect to 100 parts by mass of the polymer (A) in view of ensuring the sensitivity and developability for use as a resist. In this case, when the amount of the acid generating agent (B) employed is less than 0.1 parts by mass, the sensitivity and developability tend to be deteriorated, whereas the amount of the acid generating agent (B) exceeding 20 parts by mass is likely to result in reduction of radiation transmittance, and to render the formation of the desired resist patterns difficult.

(C) Polymer

The polymer (C) has a higher content of fluorine atoms than that of the polymer (A). When the radiation-sensitive resin composition for use in the pattern-forming method contains the polymer (C), in forming a resist film, the polymer (C) tends to be unevenly distributed in the vicinity of the surface of the resist film due to low surface free energy, i.e., a characteristic feature of the polymer (C) in the film. Thus, containing the polymer (C) is preferred since elution of an acid generating agent, an acid diffusion control agent and the like into a liquid immersion medium can be prevented during liquid immersion lithography. In addition, owing to a water repellent feature of the polymer (C), an advancing contact angle of a liquid immersion medium on a resist film can be controlled to fall within a desired range, whereby formation of bubble defects can be suppressed. Furthermore, a higher receding contact angle of a liquid immersion medium on a resist film is attained, thereby enabling exposure by high-speed scanning without remanence of water droplets. Herein, although the polymer (C) is not particularly limited as long as the properties described above are attained, the polymer (C) preferably has a fluorinated alkyl group. When the polymer (C) has a fluorinated alkyl group in the structure thereof, the characteristics can be further improved.

The polymer (C) in the embodiment of the present invention is prepared by polymerizing one or more types of monomers that include fluorine in the structure thereof.

The monomers that include fluorine in the structure thereof are exemplified by a monomer that includes a fluorine atom in its main chain, a monomer that includes a fluorine atom in its side chain, and a monomer that includes a fluorine atom in its main chain and side chain.

Examples of the monomer that includes a fluorine atom in its main chain include α-fluoroacrylate compounds, α-trifluoromethyl acrylate compounds, β-fluoroacrylate compounds, β-trifluoromethyl acrylate compounds, α,β-fluoroacrylate compounds, α,β-trifluoromethyl acrylate compounds, compounds derived by substituting hydrogen of one or more types of vinyl moieties by fluorine, a trifluoromethyl group, etc., and the like.

Further, examples of the monomer that includes a fluorine atom in its side chain include compounds in which an alicyclic olefin compound such as norbornene has fluorine, a fluoroalkyl group and/or a derivative thereof as a side chain, ester compounds of acrylic acid or methacrylic acid with a fluoroalkyl group and/or a derivative thereof, olefins having fluorine, a fluoroalkyl group and/or a derivative thereof as one or more types of side chain (a site excluding a double bond), and the like.

Also, examples of the monomer that includes a fluorine atom in its main chain and side chain include ester compounds of α-fluoroacrylic acid, β-fluoroacrylic acid, α,β-fluoroacrylic acid, α-trifluoromethyl acrylic acid, β-trifluoromethyl acrylic acid, α,β-trifluoromethylacrylic acid or the like with a fluoroalkyl group and/or a derivative thereof, compounds derived by substituting hydrogen of one or more types of vinyl moieties by fluorine or a trifluoromethyl group and substituting a side chain of the compound with fluorine, a fluoroalkyl group and/or a derivative thereof; alicyclic olefin compounds derived by substituting hydrogen(s) bonded to one or more types of double bonds by a fluorine atom or a trifluoromethyl group, etc., and having a fluorinated alkyl group and/or a derivative thereof as a side chain; and the like. The alicyclic olefin compound as referred to herein means a compound that includes a double bond in a part of its ring.

According to the embodiment of the present invention, a structural unit that imparts fluorine to the polymer (C) is not particularly limited, and a structural unit represented by the following formula (5) (hereinafter, may be also referred to as "structural unit (V)") is preferably used as a fluorine-imparting structural unit.

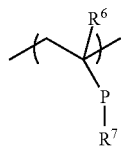

(5)

In the formula (5), $R^6$ represents a hydrogen, a methyl group or a trifluoromethyl group; P represents a linking group; $R^7$ represents a linear or branched alkyl group having 1 to 6 carbon atoms, or an alicyclic hydrocarbon group having 4 to 20 carbon atoms or a derivative thereof, having at least one or more fluorine atoms.

In the above formula (5), examples of the linking group represented by P include a single bond, an oxygen atom, a sulfur atom, a carbonyloxy group, an oxycarbonyl group, an amide group, a sulfonylamide group, an urethane group, and the like.

Examples of preferred monomer that gives the structural unit (V) include (meth)acrylic acid trifluoromethyl ester, (meth)acrylic acid 2,2,2-trifluoroethyl ester, (meth)acrylic acid perfluoroethyl ester, (meth)acrylic acid perfluoro-n-propyl ester, (meth)acrylic acid perfluoro-1-propyl ester, (meth)acrylic acid perfluoro-n-butyl ester, (meth)acrylic acid perfluoro-1-butyl ester, (meth)acrylic perfluoro-t-butyl acid ester, (meth)acrylic acid 2-(1,1,1,3,3,3-hexafluoropropyl)ester, (meth)acrylic acid 1-(2,2,3,3,4,4,5,5-octafluoropentyl) ester, (meth)acrylic acid perfluorocyclohexylmethyl ester, (meth)acrylic acid 1-(2,2,3,3,3-pentafluoropropyl)ester, (meth)acrylic acid 1-(3,3,4,4,5,5,6,6,7,7,8,8,9,9,10,10,10-heptadecafluorodecyl)ester, (meth)acrylic acid 1-(5-trifluoromethyl-3,3,4,4,5,6,6,6-octafluorohexyl)ester, and the like.

The polymer (C) may include only one type or two or more types of the structural unit (V).

The proportion of the structural unit (V) included is typically no less than 5 mol %, preferably no less than 10 mol %, and still more preferably no less than 15 mol %, provided that the entire structural units in the polymer (C) is defined as 100 mol %. When the proportion of the structural unit (V) included is less than 5 mol %, the receding contact angle becomes less than 70 degree, whereby elution of the acid generating agent and the like from the resist coating film may not be suppressed.

In addition to the structural unit including fluorine in its structure, the polymer (C) may include at least one type of "other structural units" such as, for example: in order to control rates of dissolution in developer solutions, a structural unit having an acid-labile group, a structural unit having a lactone skeleton, a hydroxyl group, a carboxyl group or the like, a structural unit having an alicyclic compound; and/or a structural unit derived from an aromatic compound for inhibiting scattering by reflection of light from the substrate.

As the other structural unit having an acid-labile group, a structural unit similar to the structural unit (II) of the polymer (A) may be used.

The structural unit (II) included in the polymer (C) is preferably (meth)acrylic acid 2-methyladamantyl-2-yl ester, (meth)acrylic acid 2-ethyladamantyl-2-yl ester, (meth)acrylic acid 2-methylbicyclo[2.2.1]hept-2-yl ester, (meth)acrylic acid 2-ethylbicyclo[2.2.1]hept-2-yl ester, (meth)acrylic acid 1-(bicyclo[2.2.1]hept-2-yl)-1-methylethyl ester, (meth)acrylic acid 1-(adamantan-1-yl)-1-methylethyl ester, (meth)acrylic acid 1-methyl-1-cyclopentyl ester, (meth)acrylic acid 1-ethyl-1-cyclopentyl ester, (meth)acrylic acid 1-methyl-1-cyclohexyl ester, (meth)acrylic acid 1-ethyl-1-cyclohexyl ester, and the like.

As the other structural unit including the lactone skeleton, a structural unit similar to the structural unit (III) of the polymer (A) may be used.

The other structural unit including the alicyclic compound is exemplified by a structural unit (VI) represented by the following formula (6).

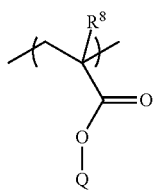

(6)

In the general formula (6), $R^8$ represents a hydrogen atom, a methyl group, or a trifluoromethyl group, and Q represents an alicyclic hydrocarbon group having 4 to 20 carbon atoms.

The alicyclic hydrocarbon group having 4 to 20 carbon atoms represented by Q in the above formula (6) is exemplified by hydrocarbon groups having an alicyclic ring derived from a cycloalkane such as cyclobutane, cyclopentane, cyclohexane, bicyclo[2.2.1]heptane, bicyclo[2.2.2]octane, tricyclo[5.2.1.0²,⁶]decane, tetracyclo[6.2.1.1³,⁶.0²,⁷]dodecane or tricyclo[3.3.1.1³,⁷]decane. A part or all of hydrogen atoms included in the alicyclic ring derived from the cycloalkane are unsubstituted or substituted by a substituent. Examples of the substituent include linear, branched or cyclic alkyl groups having 1 to 4 carbon atoms, a hydroxyl group, a cyano group, hydroxyalkyl groups having 1 to 10 carbon atoms, a carboxyl group and oxygen.

Examples of preferred monomer that gives the structural unit (VI) include (meth)acrylic acid-bicyclo[2.2.1]hept-2-yl ester, (meth)acrylic acid-bicyclo[2.2.2]oct-2-yl ester, (meth)acrylic acid-tricyclo[5.2.1.0²,⁶]dec-7-yl ester, (meth)acrylic acid-tetracyclo[6.2.1.1³,⁶.0²,⁷]dodec-9-yl ester, (meth)acrylic acid-tricyclo[3.3.1.1³,⁷]dec-1-yl ester, (meth)acrylic acid-tricyclo[3.3.1.1³,⁷]dec-2-yl ester, and the like.

In addition, examples of the monomer that gives the structural unit (VII) derived from the aromatic compound include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy)styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl(meth)acrylate, benzyl(meth)acrylate, acenaphthylene, 5-hydroxyacenaphthylene, 1-vinylnaphthalene, 2-vinylnaphthalene, 2-hydroxy-6-vinylnaphthalene, 1-naphthyl(meth)acrylate, 2-naphthyl(meth)acrylate, 1-naphthylmethyl(meth)acrylate, 1-anthryl(meth)acrylate, 2-anthryl(meth)acrylate, 9-anthryl(meth)acrylate, 9-anthrylmethyl(meth)acrylate, 1-vinylpyrene, and the like.

In the polymer (C) according to the embodiment of the present invention, one, or two or more types of the "other structural unit" may be included. The proportion of the other structural unit included is typically no greater than 80 mol %, preferably no greater than 75 mol %, and still more preferably no greater than 70 mol %, provided that the entire structural units in the polymer (C) is defined as 100 mol %.

Synthesis Method of Polymer (C)

The polymer (C) may be prepared, for example, by polymerizing the monomer corresponding to each predetermined structural unit in an appropriate solvent using a radical polymerization initiator.

The radical polymerization initiator and the solvent for use in the polymerization may include, for example, those exemplified in the synthesis method of the polymer (A).

The reaction temperature in the polymerization is typically 40° C. to 150° C., and preferably 50° C. to 120° C. The reaction time is typically 1 hour to 48 hrs, and preferably 1 hour to 24 hrs.

The Mw of the polymer (C) as determined by a GPC method is preferably 1,000 to 100,000, more preferably 1,000 to 50,000, and particularly preferably 1,000 to 30,000. When the Mw of the polymer (C) falls within the above range, sufficient solubility in resist solvents and developer solutions for use as a resist can be attained, and favorable resistance to dry-etching and favorable cross-sectional shape of the resist pattern can be obtained.

The ratio (Mw/Mn) of the Mw to the Mn of the polymer (C) is typically 1 to 3, and preferably 1 to 2.

Optional Component

In addition to the polymer (A), the acid generator (B) and the polymer (C), the composition may contain an acid diffusion controller, a solvent, a surfactant, an alicyclic skeleton-containing compound, a sensitizing agent and the like as the other optional components within a range not leading to impairment of the effects of the present invention.

Acid Diffusion Controller

The acid diffusion controller exerts the effect of controlling diffusion phenomenon of the acid generated from the acid generator (B) upon the exposure in the resist coating film, and suppressing unfavorable chemical reactions in unexposed regions; as a result, storage stability of the resultant radiation-sensitive resin composition is further improved, and resolution of the resist is further improved, while suppressing variation of line width of the resist pattern caused by variation of post-exposure delay (PED) from the exposure until a development treatment, which enables the radiation-sensitive resin composition with superior process stability to be obtained. The mode of incorporation of the acid diffusion controller into the composition may be in a free compound form or in an incorporated form as a part of the polymer, or in both of these forms.

Examples of the acid diffusion control agent include amine compounds, amide group-containing compounds, urea compounds, nitrogen-containing heterocyclic compounds, and the like.

Examples of the amine compounds include mono(cyclo)alkylamines; di(cyclo)alkylamines; tri(cyclo)alkylamines; substituted alkylaniline or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N''N'''-pentamethyldiethylenetriamine, and the like.

Examples of the amide group-containing compound include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles; pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

In addition, the acid diffusion control agent may be a photodegradable base which is sensitized upon exposure to generate a weak acid. An example of the photodegradable base includes onium salt compounds which degrade upon the exposure and lose their acid diffusion controllability. Examples of the onium salt compounds include sulfonium salt compounds represented by the following formula (7), and iodonium salt compounds represented by the following formula (8).

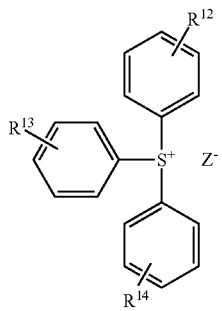

(7)

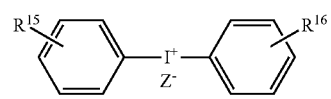

(8)

In the formula (7) and the formula (8), $R^{12}$ to $R^{16}$ each independently represent a hydrogen atom, an alkyl group, an alkoxyl group, a hydroxyl group, a halogen atom, —S—$R^{17}$, —$SO_2$—$R^{17}$, or —$OSO_2$—$R^{17}$, wherein $R^{17}$ represents an alkyl group having 1 to 10 carbon atoms, cycloalkyl group having 3 to 20 carbon atoms, an alkoxy group having 1 to 10 carbon atoms or an aryl group having 6 to 20 carbon atoms. Further, in the formula (7) and in the formula (8), $Z^-$ represents an anion represented by $OH^-$, $R^A$—$COO^-$, $R^B$—$SO_2$—$N^-$—$R^A$, $R^A$—$SO_3^-$ or the following formula (9), wherein $R^A$ represents a linear or branched alkyl group having 1 to 10 carbon atoms, a cycloalkyl group having 3 to 20 carbon atoms, an aryl group having 6 to 30 carbon atoms, or an alkaryl group having 7 to 30 carbon atoms. A part or all of hydrogen atoms of the alkyl group, the cycloalkyl group, the aryl group and the alkaryl group are unsubstituted or substituted. $R^B$ represents a linear or branched alkyl group having 1 to 10 carbon atoms or a cycloalkyl group having 3 to 20 carbon atoms which does not have or has a substituent. A part or all of hydrogen atoms of the alkyl group and the cycloalkyl group are not substituted or substituted by a fluorine atom. However, provided that $Z^-$ represents $R^A$—$SO_3^-$, any case where a fluorine atom binds to the carbon atom to which $SO_3^-$ bonds is excluded.

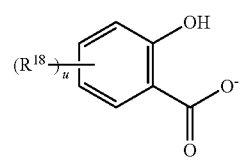

(9)

In the formula (9), $R^{18}$ represents a linear or branched alkyl group having 1 to 12 carbon atoms, or a linear or branched alkoxyl group having 1 to 12 carbon atoms, wherein a part or all of hydrogen atoms included in the above alkyl group and alkoxyl group are not substituted or substituted by a fluorine atom; and u is an integer of 0 to 2.

Examples of the photodegradable base include compounds represented by the following formulae, and the like.

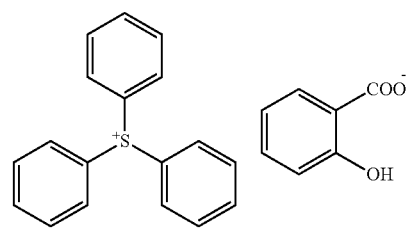

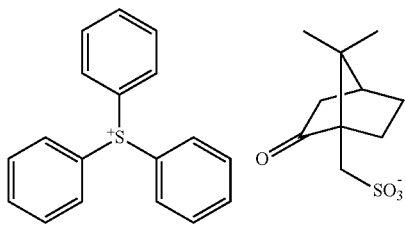

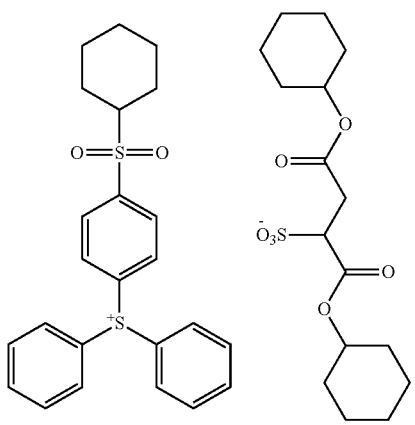

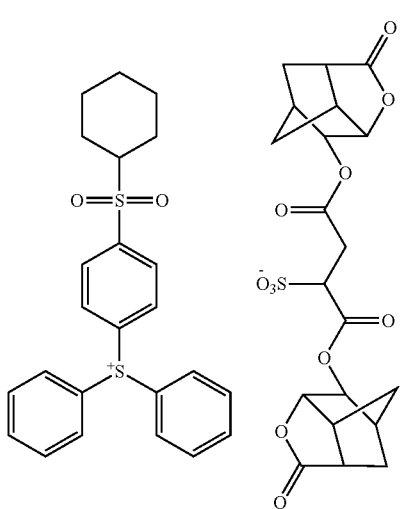

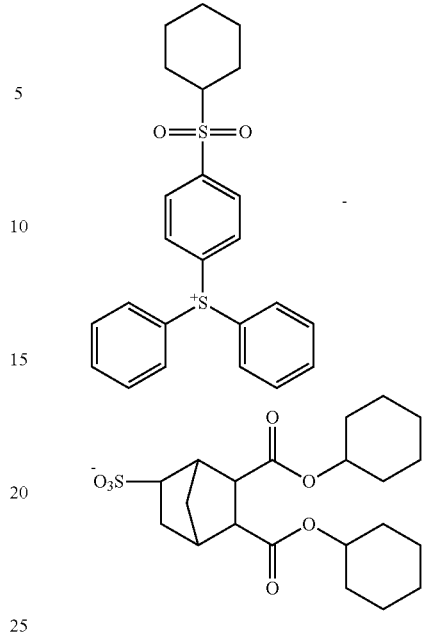

These acid diffusion controllers may be used alone, or in combination of two or more thereof. The content of the acid diffusion control agent is preferably no less than 1 part by mass and no greater than 10 parts by mass with respect to 100 parts by mass of the polymer (A). When the total amount of the acid diffusion control agent used exceeds 10 parts by mass, the sensitivity for use as a resist tends to be deteriorated.

Solvent

The composition typically contains a solvent. The solvent is not particularly limited as long as the solvent can at least dissolve the polymer (A), the acid generator (B) and the polymer (C), and optional components added as required. Examples of the solvent include alcohol solvents, ether solvents, ketone solvents, amide solvents, ester solvents and mixed solvents thereof, and the like.

Specific examples of the solvent include similar organic solvents to those exemplified in connection with the step of forming a pattern. Among these, propylene glycol monomethyl ether acetate, cyclohexanone and γ-butyrolactone are preferred. These solvents may be used either alone, or in combination of two or more thereof.

Preparation of Radiation-Sensitive Resin Composition

The composition may be prepared by mixing the polymer (A) and the acid generator (B), and as needed the polymer (C) and the other optional components at a certain ratio, in, for example, an organic solvent. Also, it is possible to prepare and use the composition in a state of being dissolved or dispersed in an appropriate organic solvent. The proportion of the polymer (C) contained is preferably 1 part by mass to 15 parts by mass, and more preferably 2 parts by mass to 10 parts by mass with respect to 100 parts by mass of the polymer (A).

EXAMPLES

Hereinafter, the present invention will be explained more specifically by way of Examples, but the present invention is not limited to these Examples.

The Mw and the Mn of polymers were determined by using GPC columns (Tosoh Corporation, G2000HXL×2, G3000HXL×1, G4000HXL×1) under the following analytical condition: column temperature: 40° C.

elution solvent: tetrahydrofuran (Wako Pure Chemical Industries, Ltd.)

flow rate: 1.0 mL/min sample concentration: 1.0% by mass sample injection amount: 100 μL detector: differential refractometer standard substance: mono-dispersed polystyrene $^{13}$C-NMR analysis and $^{13}$C-NMR analysis were carried out using a nuclear magnetic resonance apparatus (JEOL, Ltd., JNM-EX270) for the measurement.

Synthesis of Polymer (A)

Synthesis Example 1

A solution was prepared by dissolving 19.1 g (50 mol %) of a monomer represented by the following formula (M-1) and 10.9 g (50 mol %) of a monomer represented by formula (M-14) in 60 g of 2-butanone, and further adding 0.32 g of dimethylazobisisobutyronitrile thereto. Next, a 200 mL three-necked flask charged with 30 g of 2-butanone was purged with nitrogen for 30 minutes, and thereafter the reaction vessel was heated to 80° C. with stirring. The monomer solution prepared beforehand was added dropwise using a dropping funnel over 3 hrs. The time when dropwise addition was started was assumed to be a start time point of polymerization and the polymerization reaction was carried out for 6 hours. After completion of the polymerization, the polymerization solution was cooled to no greater than 30° C. by water-cooling and the polymerization solution was charged into 600 g of methanol. The white powder precipitated was filtered off. Thus resultant white powder was washed twice with 150 g of methanol in the state of slurry, and thereafter filtered off and dried at 50° C. for 17 hrs to obtain a polymer (A-1) as a white powder (Mw: 16,800, Mw/Mn: 1.59, yield: 80%). The proportion of structural units derived from the monomer (M-1)/monomer (M-14) in (A-1) was 48/52 (mol %).

Synthesis Examples 2 to 15

Polymers (A-2) to (A-15) were obtained in a similar manner to Synthesis Example 1 except that the monomers specified in Table 1 were blended in the predetermined amount. In addition, Table 1 collectively presents the Mw, Mw/Mn, and yield (%) of the respective polymers obtained, and the content of the structural units derived from the respective monomers in the respective polymers. It should be noted that the monomers used in the synthesis of the polymer (A), and the monomers used are represented by the following formulae.

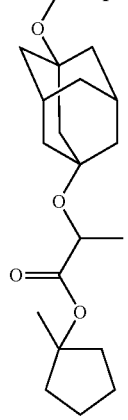

(M-1)

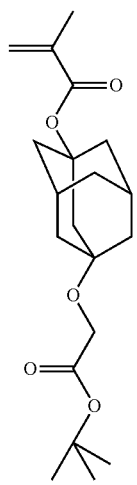

(M-2)

(M-3)

(M-4)

(M-5)
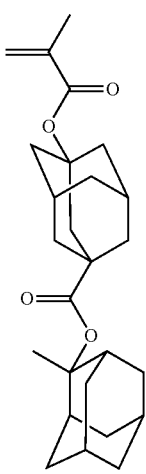
(M-6)
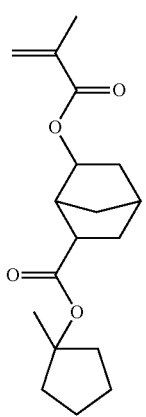
(M-7)
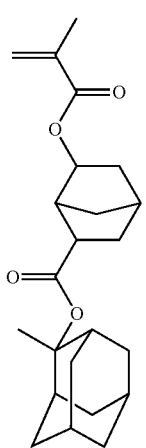
(M-8)
(M-9)
(M-10)
(M-11)
(M-12)
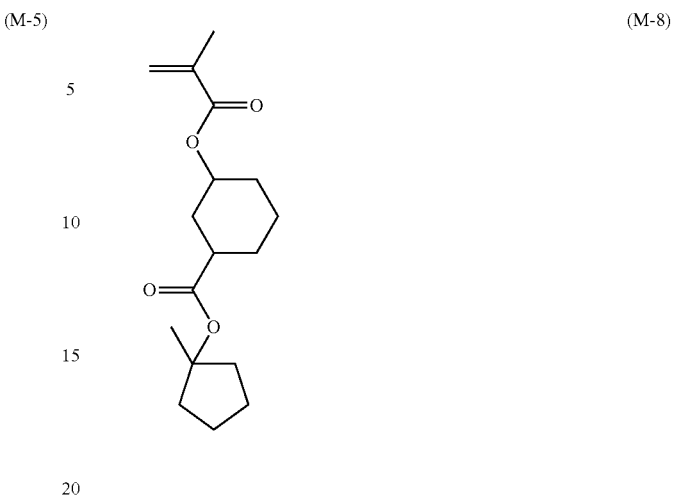
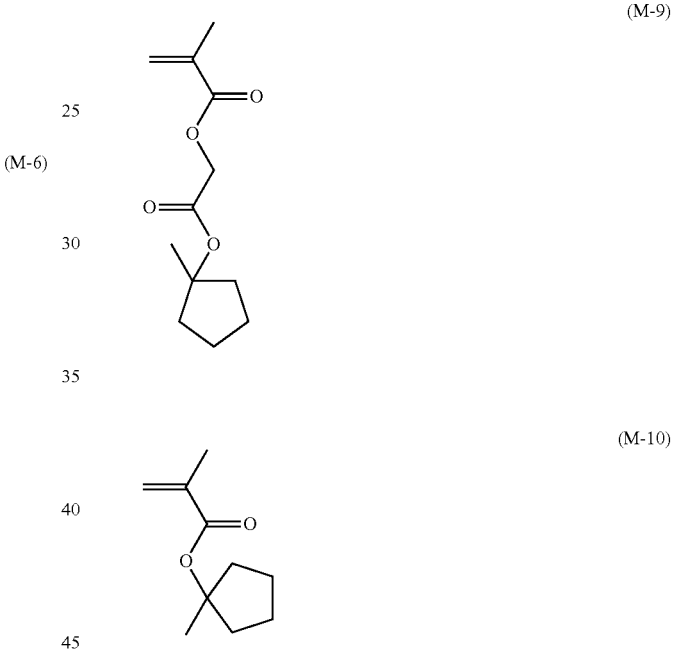
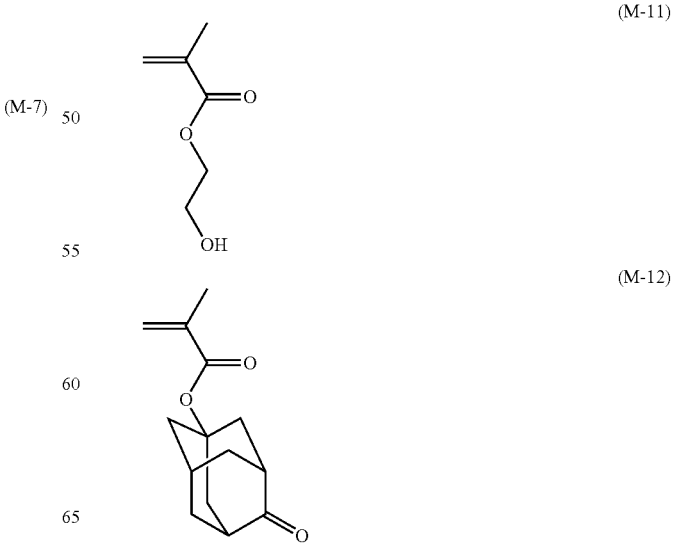

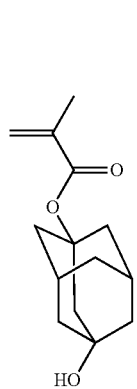

(M-13)

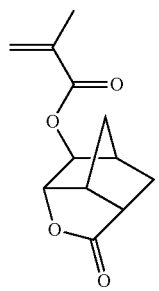

(M-14)

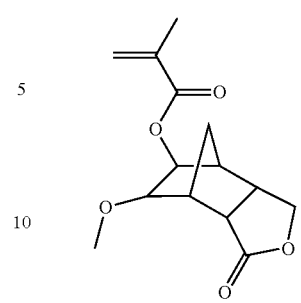

(M-15)

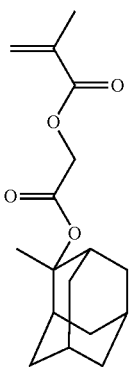

(M-16)

TABLE 1

| | (A) Polymer | Monomer | | | | | | | | |
|---|---|---|---|---|---|---|---|---|---|---|
| | | Structural unit (I) | | Structural unit (II) | | Structural unit (III) | | Structural unit (IV) | | Other structural unit |
| | | type | amount blended (% by mole) | type | amount blended (% by mole) | type | amount blended (% by mole) | type | amount blended (% by mole) | type | amount blended (% by mole) |
| Synthesis Example 1 | A-1 | M-1 | 50 | — | — | M-14 | 50 | — | — | — | — |
| Synthesis Example 2 | A-2 | M-1 | 40 | — | — | M-15 | 50 | M-11 | 10 | — | — |
| Synthesis Example 3 | A-3 | M-2 | 40 | — | — | M-15 | 50 | M-11 | 10 | — | — |
| Synthesis Example 4 | A-4 | M-2 | 40 | — | — | M-15 | 45 | M-12 | 5 | — | — |
| Synthesis Example 5 | A-5 | M-3 | 50 | — | — | M-14 | 50 | — | — | — | — |
| Synthesis Example 6 | A-6 | M-4 | 50 | — | — | M-14 | 50 | — | — | — | — |
| Synthesis Example 7 | A-7 | M-4 | 30 | — | — | M-15 | 50 | M-12 | 20 | — | — |
| Synthesis Example 8 | A-8 | M-6 | 50 | — | — | M-14 | 50 | — | — | — | — |
| Synthesis Example 9 | A-9 | M-6 | 40 | — | — | M-15 | 50 | M-11 | 10 | — | — |
| Synthesis Example 10 | A-10 | — | — | M-10 | 50 | M-14 | 50 | — | — | — | — |
| Synthesis Example 11 | A-11 | M-5 | 40 | — | — | M-14 | 40 | M-13 | 10 | — | — |
| Synthesis Example 12 | A-12 | M-7 | 50 | — | — | M-14 | 40 | M-13 | 10 | — | — |
| Synthesis Example 13 | A-13 | M-8 | 40 | — | — | M-15 | 45 | M-12 | 15 | — | — |
| Synthesis Example 14 | A-14 | — | — | — | — | M-15 | 50 | — | — | M-9 | 50 |

TABLE 1-continued

| | | | | | | | |
|---|---|---|---|---|---|---|---|
| Synthesis Example 15 | A-15 | — | — | — | — | M-14 40 | M-13 10 | M-16 50 |

| | Content of each structural unit (mol %) | | | | | Yield (%) | Physical property | |
|---|---|---|---|---|---|---|---|---|
| | Structural unit (I) | Structural unit (II) | Structural unit (III) | Structural unit (IV) | Other structural unit | | Mw | Mw/Mn |
| Synthesis Example 1 | 48 | — | 52 | — | — | 80 | 16,800 | 1.59 |
| Synthesis Example 2 | 38 | — | 51 | 11 | — | 83 | 13,300 | 1.50 |
| Synthesis Example 3 | 36 | — | 51 | 13 | — | 68 | 13,300 | 1.60 |
| Synthesis Example 4 | 38 | — | 46 | 6 | — | 78 | 12,500 | 1.48 |
| Synthesis Example 5 | 48 | — | 52 | — | — | 72 | 13,500 | 1.41 |
| Synthesis Example 6 | 49 | — | 51 | — | — | 85 | 10,200 | 1.56 |
| Synthesis Example 7 | 28 | — | 51 | 21 | — | 83 | 11,100 | 1.60 |
| Synthesis Example 8 | 48 | — | 52 | — | — | 75 | 18,800 | 1.60 |
| Synthesis Example 9 | 38 | — | 51 | 11 | — | 79 | 15,200 | 1.49 |
| Synthesis Example 10 | — | 51 | 49 | — | — | 89 | 12,800 | 1.47 |
| Synthesis Example 11 | 41 | — | 39 | 10 | — | 80 | 15,200 | 1.53 |
| Synthesis Example 12 | 49 | — | 41 | 10 | — | 78 | 15,500 | 1.60 |
| Synthesis Example 13 | 41 | — | 45 | 14 | — | 79 | 14,800 | 1.55 |
| Synthesis Example 14 | — | — | 50 | — | 50 | 82 | 12,300 | 1.51 |
| Synthesis Example 15 | — | — | 40 | 10 | 50 | 76 | 10,900 | 1.59 |

(B) Radiation-Sensitive Acid Generator

The radiation-sensitive acid generators (B) used in the preparation of the composition are as in the following. B-1 to B-3: compounds represented by the following formulae (B-1) to (B-3).

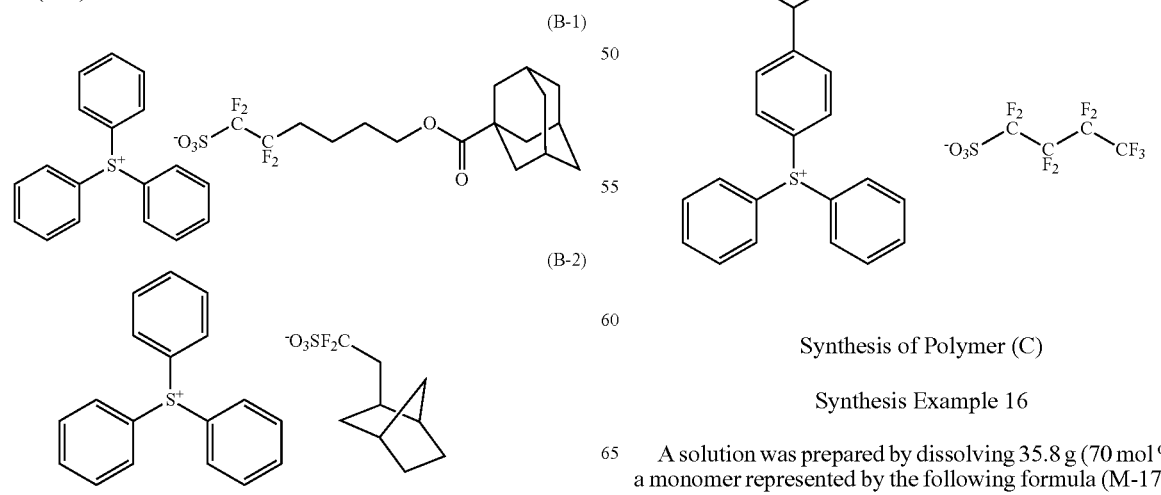

Synthesis of Polymer (C)

Synthesis Example 16

A solution was prepared by dissolving 35.8 g (70 mol %) of a monomer represented by the following formula (M-17) and 14.2 g (30 mol %) of a monomer represented by the formula (M-18) in 50 g of 2-butanone, and further adding 5.17 g of dimethyl-2.2'-azobisisobutyrate thereto. Next, a 500 mL three-necked flask charged with 50 g of 2-butanone was purged with nitrogen for 30 minutes, and thereafter the reaction vessel was heated to 80° C. with stirring. The monomer solution prepared beforehand was added dropwise using a dropping funnel over 3 hrs. The time when dropwise addition was started was assumed to be a start time point of polymerization and the polymerization reaction was carried out for 6 hours. After completion of the polymerization, the solution was cooled to no greater than 30° C. by water-cooling and transferred to a 2 l separating funnel, and homogeneously diluted with 150 g of n-hexane, followed by addition of 600 g of methanol and the components were mixed. Then 30 g of distilled water was poured and the mixture was further stirred, and allowed to stand for 30 minutes. Thereafter, the lower layer was collected, and a propylene glycol monomethyl ether acetate solution was prepared. Thus a polymer (C-1) was obtained (Mw: 7,000, Mw/Mn: 1.60, yield: 66%). The proportion of structural units derived from (M-17)/(M-18) in (C-1) was 71/29 (mol %).

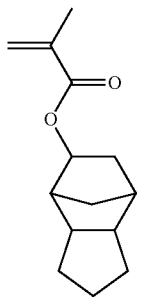

(M-17)

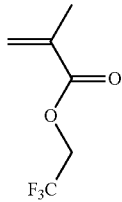

(M-18)

The acid diffusion control agents and solvents used in the preparation of the composition are as in the following.

Acid Diffusion Control Agent

D-1 to D-3: compounds represented by the following formulae (D-1) to (D-3)

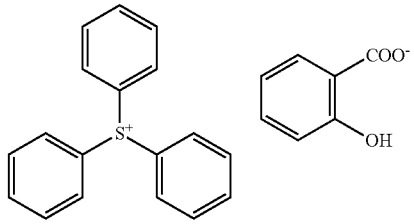

(D-1)

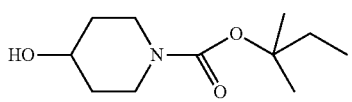

(D-2)

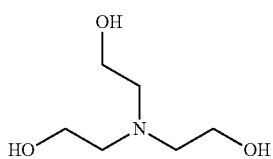

(D-3)

Solvent

E-1: propylene glycol monomethyl ether acetate

E-2: cyclohexanone

E-3: γ-butyrolactone

Example 1

A radiation-sensitive resin composition (R-1) was prepared by mixing 100 parts by mass of A-1, 3 parts by mass of C-1, 12.8 parts by mass of B-1, 5 parts by mass of D-1, 1,646 parts by mass of E-1, 705 parts by mass of E-2, and 30 parts by mass of E-3.

Examples 2 to 25 and Comparative Examples 1 to 3

Radiation-sensitive resin compositions (R-2) to (R-27) were obtained in a similar manner to Example 1 except that the polymer (A), the acid generator (B) and the acid diffusion control agent of the type and amount presented in Table 2 were used.

TABLE 2

| | Radiation-sensitive resin composition | (A) Polymer type | amount blended (parts by mass) | (C) Polymer type | amount blended (parts by mass) | (B) Acid generator type | amount blended (parts by mass) | Acid diffusion control agent type | amount blended (parts by mass) |
|---|---|---|---|---|---|---|---|---|---|
| Example 1 | R-1 | A-1 | 100 | C-1 | 3 | B-1 | 12.8 | D-1 | 5 |
| Example 2 | R-2 | A-2 | 100 | C-1 | 3 | B-1 | 12.8 | D-1 | 5 |
| Example 3 | R-3 | A-3 | 100 | C-1 | 3 | B-1 | 12.8 | D-1 | 5 |
| Example 4 | R-4 | A-4 | 100 | C-1 | 3 | B-1 | 12.8 | D-1 | 5 |
| Example 5 | R-5 | A-5 | 100 | C-1 | 3 | B-1 | 12.8 | D-1 | 5 |
| Example 6 | R-6 | A-6 | 100 | C-1 | 3 | B-1 | 12.8 | D-1 | 5 |
| Example 7 | R-7 | A-7 | 100 | C-1 | 3 | B-1 | 12.8 | D-1 | 5 |
| Example 8 | R-8 | A-8 | 100 | C-1 | 3 | B-1 | 12.8 | D-1 | 5 |
| Example 9 | R-9 | A-9 | 100 | C-1 | 3 | B-1 | 12.8 | D-1 | 5 |

TABLE 2-continued

|  | Radiation-sensitive resin composition | (A) Polymer type | (A) Polymer amount blended (parts by mass) | (C) Polymer type | (C) Polymer amount blended (parts by mass) | (B) Acid generator type | (B) Acid generator amount blended (parts by mass) | Acid diffusion control agent type | Acid diffusion control agent amount blended (parts by mass) |
|---|---|---|---|---|---|---|---|---|---|
| Example 10 | R-10 | A-1 | 100 | C-1 | 3 | B-2 | 10.2 | D-2 | 1 |
| Example 11 | R-11 | A-1 | 100 | C-1 | 3 | B-3 | 12.1 | D-3 | 1 |
| Example 12 | R-12 | A-2 | 100 | C-1 | 3 | B-2 | 10.2 | D-3 | 1 |
| Example 13 | R-13 | A-3 | 100 | C-1 | 3 | B-3 | 12.1 | D-3 | 1 |
| Example 14 | R-14 | A-4 | 100 | C-1 | 3 | B-3 | 12.1 | D-2 | 1 |
| Example 15 | R-15 | A-5 | 100 | C-1 | 3 | B-2 | 10.2 | D-2 | 1 |
| Example 16 | R-16 | A-6 | 100 | C-1 | 3 | B-1 | 12.8 | D-2 | 1 |
| Example 17 | R-17 | A-6 | 100 | C-1 | 3 | B-3 | 12.1 | D-2 | 1 |
| Example 18 | R-18 | A-7 | 100 | C-1 | 3 | B-3 | 12.1 | D-3 | 1 |
| Example 19 | R-19 | A-8 | 100 | C-1 | 3 | B-1 | 12.8 | D-2 | 1 |
| Example 20 | R-20 | A-8 | 100 | C-1 | 3 | B-3 | 12.1 | D-3 | 1 |
| Example 21 | R-21 | A-9 | 100 | C-1 | 3 | B-2 | 10.2 | D-2 | 1 |
| Example 22 | R-22 | A-11 | 100 | C-1 | 3 | B-1 | 12.8 | D-1 | 5 |
| Example 23 | R-23 | A-11 | 100 | C-1 | 3 | B-3 | 12.1 | D-2 | 1 |
| Example 24 | R-24 | A-12 | 100 | C-1 | 3 | B-1 | 12.8 | D-1 | 5 |
| Example 25 | R-25 | A-13 | 100 | C-1 | 3 | B-2 | 10.2 | D-1 | 5 |
| Comparative Example 1 | R-26 | A-10 | 100 | C-1 | 3 | B-1 | 12.8 | D-1 | 5 |
| Comparative Example 2 | R-27 | A-14 | 100 | C-1 | 3 | B-1 | 12.8 | D-1 | 5 |
| Comparative Example 3 | R-28 | A-15 | 100 | C-1 | 3 | B-1 | 12.8 | D-1 | 5 |

Formation of Resist Pattern

Example 26

An organic antireflective film-forming agent (Nissan Chemical Industries, Ltd., ARC66) was coated onto the surface of a wafer to provide an organic antireflective film having a film thickness of 105 nm. The radiation-sensitive composition (R-1) was spin-coated on the surface of the substrate using CLEAN TRACK (Tokyo Electron Limited, ACT12), subjected to soft baking on a hot plate at 90° C. for 60 sec, whereby a resist film having a film thickness of 0.10 µm was provided. Using pure water as an immersion liquid, the resist film was subjected to reduced projection exposure using a full field stepper (Nikon Corporation, S610C, numerical aperture: 1.30, lighting: Quadrupole) such that a hole pattern formed between a dot pattern mask and the resist film through an aqueous immersion liquid includes holes having a diameter of 0.055 µm, with a pitch of 0.110 µm. Thereafter, post exposure baking was carried out at 105° C. for 60 sec, followed by development with butyl acetate at 23° C. for 30 sec. After a rinse treatment with a 4-methyl-2-pentanol solvent was carried out for 10 sec, the wafer was spun at a rotation frequency of 2,000 rpm for 10 sec to form a negative resist pattern.

Examples 27 to 77 and Comparative Examples 4 to 9

Resist patterns were formed in a similar manner to Example 26 except that the radiation-sensitive composition and the developer solution presented in Tables 3-1 to 3-3 were used.
Evaluations
The following each evaluation was made on the resist patterns thus formed. The results are collectively shown in Tables 3-1 to 3-3.
Sensitivity (mJ/cm$^2$)
An optimum dose at which a hole pattern having a diameter of 0.055 µm was formed by reduced projection exposure through an immersion liquid (water) and a mask having a dot pattern formed so that a hole pattern having a diameter of 0.055 µm and a pitch of 0.110 µm was obtained, was taken as the sensitivity (mJ/cm$^2$). The measurement was performed using a scanning electron microscope ("CG4000", Hitachi High-Technologies Corporation).
Cross-Sectional Shape
A cross-sectional shape of the 0.055 µm hole pattern formed in the evaluation of the Sensitivity was observed ("S-4800", Hitachi High-Technologies Corporation). A line width Lb at the middle of the resist pattern, and a line width La of the top of the film were measured. When La and Lb satisfied the inequality of $0.9 \leq (La/Lb) \leq 1.1$, the evaluation was made as "favorable", whereas when the inequality was not satisfied, the evaluation was made as "unfavorable".
Critical Dimension Uniformity (CDU)
A hole pattern (diameter: 0.055 µm) that was formed on the resist film on the substrate at the optimum dose was observed from above using a scanning electron microscope ("CG4000", Hitachi High-Technologies Corporation). The diameter (µm) was measured at arbitrary points, and a variation 3σ in diameter was evaluated.
Mask Error Enhancement Factor (MEEF)
A hole pattern having a pitch of 0.110 µm was formed at the optimum dose using a mask pattern designed so that the target size of a hole pattern formed by reduced projection exposure was 0.051 µm, 0.053 µm, 0.057 µm, or 0.059 µm. A graph was drawn by plotting the target size (µm) of the hole pattern formed by reduced projection exposure (horizontal axis) and the size (µm) of the hole pattern formed on the resist film on the substrate by reduced projection exposure (vertical axis), and the slope of the straight line of the graph was calculated as the mask error enhancement factor (MEEF). The mask reproducibility was determined to be better as the MEEF (slope of straight line) was closer to 1.
Resolving Ability (nm)
Exposure was carried out through a mask having a dot pattern that gave a hole pattern having a diameter of 0.055 µm and a pitch of 0.110 µm after reduced projection exposure, and a minimum dimension (nm) of the hole was measured, which was obtained as exposure dose was increased.

Etching Resistance

An organic antireflective film-forming agent (Nissan Chemical Industries, Ltd., ARC66) was coated onto the surface of a wafer to provide an organic antireflective film having a film thickness of 105 nm. The radiation-sensitive composition was spin-coated on the surface of the substrate using CLEAN TRACK (Tokyo Electron Limited, ACT12), subjected to soft baking on a hot plate at 90° C. for 60 sec, whereby a resist film having a film thickness of 0.10 μm was provided. The resist film on the substrate was exposed by irradiation with ArF light on the entire face at a dose of 50 mJ/cm$^2$, and the etching rate of the resist film after the development with an organic solvent was calculated. The etching resistance was determined to be "favorable" when the etching rate was less than 100 nm/min, whereas the etching resistance was determined to be "unfavorable" when the etching rate was no less than 100 nm/min. In the etching test, an etching system (Tokyo Electron Limited, Telius) was used, and the evaluation was made under the following etching condition.
CF$_4$ gas flow rate: 150 sccm
chamber pressure: 100 mTorr
power: 300 W (upper)/300 W (bottom)
time: 20 sec Exposure Latitude (EL)

With respect to diameters of hole patterns formed by exposure carried out through a mask having a dot pattern that gave a hole pattern having a diameter of 0.055 μm and a pitch of 0.110 μm after reduced projection exposure, an exposure dose Eop at which the formed hole pattern had a diameter of 0.055 μm, an exposure dose Emin at which the formed hole pattern had a diameter of 0.061 μm, and an exposure dose Emax at which the formed hole pattern had a diameter of 0.050 μm were determined. Then, exposure latitude (EL) was calculated according to the following formula:

exposure latitude(%)=100×(Emax−Emin)/Eop.

A greater EL value indicates a smaller change in patterning capability due to a change in exposure dose, suggesting a favorable result.

Depth of Focus (DOF)

With respect to hole patterns formed by exposure carried out through a mask having a dot pattern that gave a hole pattern having a diameter of 0.055 μm and a pitch of 0.110 μm after reduced projection exposure, the focus amplitude (μm) when the hole pattern had a diameter falling within the range of ±10% of 0.055 μm was taken as the depth of focus (DOF). A greater DOF value indicates a smaller change in patterning capability due to a change in focus, suggesting a favorable result.

TABLE 3-1

| | Radiation-sensitive resin composition | PB temperature (° C.) | time (sec) | PEB temperature (° C.) | time (sec) | Developer solution | Etching rate (nm/min) | Sensitivity (mJ/cm$^2$) | EL (%) | DOF (μm) | Resolving ability (μm) | CDU (μm) | MEEF | Cross-sectional shape |
|---|---|---|---|---|---|---|---|---|---|---|---|---|---|---|
| Example 26 | R-1 | 90 | 60 | 105 | 60 | butyl acetate | 87.2 | 19.0 | 9.7 | 0.15 | 0.036 | 0.0033 | 4.4 | favorable |
| Example 27 | R-1 | 90 | 60 | 105 | 60 | isoamyl acetate | 93.0 | 20.0 | 10.1 | 0.15 | 0.038 | 0.0033 | 4.5 | favorable |
| Example 28 | R-1 | 90 | 60 | 105 | 60 | methyl ethyl ketone | 91.8 | 25.0 | 10.0 | 0.15 | 0.037 | 0.0034 | 4.6 | favorable |
| Example 29 | R-2 | 90 | 60 | 105 | 60 | butyl acetate | 98.8 | 20.5 | 10.0 | 0.12 | 0.037 | 0.0032 | 4.8 | favorable |
| Example 30 | R-2 | 90 | 60 | 105 | 60 | isoamyl acetate | 98.8 | 21.0 | 10.1 | 0.12 | 0.039 | 0.0032 | 4.7 | favorable |
| Example 31 | R-2 | 90 | 60 | 105 | 60 | methyl ethyl ketone | 97.2 | 27.0 | 10.5 | 0.12 | 0.038 | 0.0034 | 4.9 | favorable |
| Example 32 | R-3 | 90 | 60 | 105 | 60 | butyl acetate | 93.0 | 28.5 | 9.0 | 0.12 | 0.037 | 0.003 | 4.7 | favorable |
| Example 33 | R-3 | 90 | 60 | 105 | 60 | methyl ethyl ketone | 97.2 | 34.0 | 9.4 | 0.12 | 0.034 | 0.0031 | 4.8 | favorable |
| Example 34 | R-4 | 90 | 60 | 105 | 60 | isoamyl acetate | 87.2 | 30.0 | 9.4 | 0.15 | 0.036 | 0.0032 | 4.4 | favorable |
| Example 35 | R-4 | 90 | 60 | 105 | 60 | methyl amyl ketone | 86.4 | 36.0 | 9.9 | 0.15 | 0.039 | 0.0034 | 4.5 | favorable |
| Example 36 | R-5 | 90 | 60 | 105 | 60 | butyl acetate | 75.5 | 28.0 | 9.6 | 0.15 | 0.037 | 0.0032 | 4.6 | favorable |
| Example 37 | R-5 | 90 | 60 | 105 | 60 | methyl amyl ketone | 81.0 | 34.0 | 10.1 | 0.15 | 0.037 | 0.0035 | 4.8 | favorable |
| Example 38 | R-6 | 90 | 60 | 105 | 60 | butyl acetate | 75.5 | 18.5 | 11.4 | 0.15 | 0.035 | 0.0032 | 4.4 | favorable |
| Example 39 | R-6 | 90 | 60 | 105 | 60 | methyl amyl ketone | 81.0 | 22.0 | 11.2 | 0.15 | 0.039 | 0.0033 | 4.5 | favorable |
| Example 40 | R-7 | 90 | 60 | 105 | 60 | butyl acetate | 81.4 | 17.5 | 10.1 | 0.15 | 0.036 | 0.0031 | 4.7 | favorable |
| Example 41 | R-7 | 90 | 60 | 105 | 60 | methyl amyl ketone | 81.0 | 20.0 | 10.3 | 0.15 | 0.039 | 0.0031 | 4.9 | favorable |
| Example 42 | R-8 | 90 | 60 | 105 | 60 | butyl acetate | 87.2 | 17.0 | 10.8 | 0.15 | 0.038 | 0.0032 | 4.5 | favorable |
| Example 43 | R-8 | 90 | 60 | 105 | 60 | methyl amyl ketone | 81.0 | 19.0 | 10.9 | 0.15 | 0.037 | 0.0035 | 4.8 | favorable |
| Example 44 | R-9 | 90 | 60 | 105 | 60 | butyl acetate | 98.8 | 15.0 | 10.8 | 0.15 | 0.037 | 0.0032 | 4.6 | favorable |

TABLE 3-1-continued

| | Radiation-sensitive resin composition | PB temperature (° C.) | PB time (sec) | PEB temperature (° C.) | PEB time (sec) | Developer solution | Etching rate (nm/min) | Sensitivity (mJ/cm²) | EL (%) | DOF (μm) | Resolving ability (μm) | CDU (μm) | MEEF | Cross-sectional shape |
|---|---|---|---|---|---|---|---|---|---|---|---|---|---|---|
| Example 45 | R-9 | 90 | 60 | 105 | 60 | methyl amyl ketone | 97.2 | 18.0 | 11.4 | 0.15 | 0.039 | 0.0035 | 4.6 | favorable |

TABLE 3-2

| | Radiation-sensitive resin composition | PB temperature (° C.) | PB time (sec) | PEB temperature (° C.) | PEB time (sec) | Developer solution | Etching rate (nm/min) | Sensitivity (mJ/cm²) | EL (%) | DOF (μm) | Resolving ability (μm) | CDU (μm) | MEEF | Cross-sectional shape |
|---|---|---|---|---|---|---|---|---|---|---|---|---|---|---|
| Example 46 | R-10 | 90 | 60 | 105 | 60 | butyl acetate | 87.2 | 22.0 | 10.3 | 0.15 | 0.036 | 0.0033 | 4.6 | favorable |
| Example 47 | R-10 | 90 | 60 | 105 | 60 | methyl amyl ketone | 86.4 | 24.0 | 10.9 | 0.15 | 0.035 | 0.0032 | 4.6 | favorable |
| Example 48 | R-11 | 90 | 60 | 105 | 60 | butyl acetate | 87.2 | 18.0 | 9.4 | 0.12 | 0.038 | 0.0036 | 4.8 | favorable |
| Example 49 | R-11 | 90 | 60 | 105 | 60 | methyl amyl ketone | 86.4 | 19.0 | 9.6 | 0.12 | 0.038 | 0.0035 | 4.8 | favorable |
| Example 50 | R-12 | 90 | 60 | 105 | 60 | butyl acetate | 98.8 | 22.0 | 9.5 | 0.15 | 0.039 | 0.0034 | 4.8 | favorable |
| Example 51 | R-12 | 90 | 60 | 105 | 60 | methyl amyl ketone | 97.2 | 24.0 | 9.8 | 0.15 | 0.039 | 0.0036 | 4.8 | favorable |
| Example 52 | R-13 | 90 | 60 | 105 | 60 | butyl acetate | 93.0 | 26.0 | 8.6 | 0.12 | 0.039 | 0.0035 | 4.9 | favorable |
| Example 53 | R-13 | 90 | 60 | 105 | 60 | methyl amyl ketone | 97.2 | 32.0 | 8.9 | 0.12 | 0.038 | 0.0036 | 4.9 | favorable |
| Example 54 | R-14 | 90 | 60 | 105 | 60 | butyl acetate | 87.2 | 27.0 | 8.6 | 0.12 | 0.039 | 0.0036 | 4.9 | favorable |
| Example 55 | R-14 | 90 | 60 | 105 | 60 | methyl amyl ketone | 86.4 | 30.0 | 8.8 | 0.12 | 0.039 | 0.0036 | 4.9 | favorable |
| Example 56 | R-15 | 90 | 60 | 105 | 60 | butyl acetate | 75.5 | 30.0 | 10.2 | 0.15 | 0.036 | 0.0032 | 4.7 | favorable |
| Example 57 | R-15 | 90 | 60 | 105 | 60 | methyl amyl ketone | 81.0 | 36.0 | 10.7 | 0.15 | 0.036 | 0.0033 | 4.7 | favorable |
| Example 58 | R-16 | 90 | 60 | 105 | 60 | butyl acetate | 75.5 | 19.0 | 11.9 | 0.15 | 0.037 | 0.0033 | 4.5 | favorable |
| Example 59 | R-16 | 90 | 60 | 105 | 60 | methyl amyl ketone | 81.0 | 23.0 | 11.6 | 0.15 | 0.039 | 0.0034 | 4.6 | favorable |
| Example 60 | R-17 | 90 | 60 | 105 | 60 | butyl acetate | 75.5 | 17.0 | 10.3 | 0.12 | 0.039 | 0.0036 | 4.8 | favorable |
| Example 61 | R-17 | 90 | 60 | 105 | 60 | methyl amyl ketone | 81.0 | 21.0 | 9.9 | 0.12 | 0.039 | 0.0037 | 4.9 | favorable |
| Example 62 | R-18 | 90 | 60 | 105 | 60 | butyl acetate | 81.4 | 16.5 | 9.4 | 0.12 | 0.039 | 0.0036 | 4.9 | favorable |
| Example 63 | R-18 | 90 | 60 | 105 | 60 | methyl amyl ketone | 81.0 | 17.5 | 9.0 | 0.12 | 0.039 | 0.0036 | 4.9 | favorable |
| Example 64 | R-19 | 90 | 60 | 105 | 60 | butyl acetate | 87.2 | 17.5 | 11.0 | 0.15 | 0.037 | 0.0033 | 4.5 | favorable |

TABLE 3-3

| | Radiation-sensitive resin composition | PB temperature (° C.) | PB time (sec) | PEB temperature (° C.) | PEB time (sec) | Developer solution | Etching rate (nm/min) | Sensitivity (mJ/cm²) | EL (%) | DOF (μm) | Resolving ability (μm) | CDU (μm) | MEEF | Cross-sectional shape |
|---|---|---|---|---|---|---|---|---|---|---|---|---|---|---|
| Example 65 | R-19 | 90 | 60 | 105 | 60 | methyl amyl ketone | 81.0 | 19.5 | 11.8 | 0.15 | 0.036 | 0.0034 | 4.6 | favorable |
| Example 66 | R-20 | 90 | 60 | 105 | 60 | butyl acetate | 87.2 | 15.0 | 9.4 | 0.12 | 0.039 | 0.0035 | 4.8 | favorable |

TABLE 3-3-continued

| | Radiation-sensitive resin composition | PB temperature (°C.) | PB time (sec) | PEB temperature (°C.) | PEB time (sec) | Developer solution | Etching rate (nm/min) | Sensitivity (mJ/cm$^2$) | EL (%) | DOF (μm) | Resolving ability (μm) | CDU (μm) | MEEF | Cross-sectional shape |
|---|---|---|---|---|---|---|---|---|---|---|---|---|---|---|
| Example 67 | R-20 | 90 | 60 | 105 | 60 | methyl amyl ketone | 81.0 | 17.5 | 9.8 | 0.12 | 0.038 | 0.0036 | 4.8 | favorable |
| Example 68 | R-21 | 90 | 60 | 105 | 60 | butyl acetate | 98.8 | 17.0 | 11.8 | 0.15 | 0.036 | 0.0033 | 4.6 | favorable |
| Example 69 | R-21 | 90 | 60 | 105 | 60 | methyl amyl ketone | 97.2 | 19.0 | 12.0 | 0.15 | 0.038 | 0.0034 | 4.6 | favorable |
| Example 70 | R-22 | 90 | 60 | 105 | 60 | butyl acetate | 75.5 | 28.5 | 8.0 | 0.12 | 0.037 | 0.0038 | 4.7 | favorable |
| Example 71 | R-22 | 90 | 60 | 105 | 60 | methyl amyl ketone | 75.6 | 30.0 | 8.2 | 0.12 | 0.038 | 0.0039 | 4.8 | favorable |
| Example 72 | R-23 | 90 | 60 | 110 | 60 | butyl acetate | 75.5 | 25.0 | 7.3 | 0.10 | 0.039 | 0.0039 | 4.9 | favorable |
| Example 73 | R-23 | 90 | 60 | 110 | 60 | methyl amyl ketone | 75.6 | 27.5 | 7.9 | 0.10 | 0.039 | 0.0039 | 4.9 | favorable |
| Example 74 | R-24 | 90 | 60 | 110 | 60 | butyl acetate | 87.2 | 26.0 | 8.3 | 0.12 | 0.037 | 0.0038 | 4.8 | favorable |
| Example 75 | R-24 | 90 | 60 | 110 | 60 | methyl amyl ketone | 86.4 | 29.5 | 8.9 | 0.12 | 0.038 | 0.0039 | 4.8 | favorable |
| Example 76 | R-25 | 90 | 60 | 110 | 60 | butyl acetate | 98.6 | 25.5 | 8.8 | 0.12 | 0.038 | 0.0039 | 4.7 | favorable |
| Example 77 | R-25 | 90 | 60 | 110 | 60 | methyl amyl ketone | 99.2 | 28.0 | 8.9 | 0.12 | 0.038 | 0.0039 | 4.9 | favorable |
| Comparative Example 4 | R-26 | 90 | 60 | 105 | 60 | butyl acetate | 113.0 | 14.0 | 10.9 | 0.15 | 0.036 | 0.0028 | 4.2 | favorable |
| Comparative Example 5 | R-26 | 90 | 60 | 105 | 60 | methyl amyl ketone | 119.0 | 20.0 | 11.7 | 0.15 | 0.035 | 0.0027 | 4.6 | favorable |
| Comparative Example 6 | R-27 | 90 | 60 | 105 | 60 | butyl acetate | 108.3 | 16.0 | 9.9 | 0.12 | 0.038 | 0.0036 | 4.5 | unfavorable |
| Comparative Example 7 | R-27 | 90 | 60 | 105 | 60 | methyl amyl ketone | 109.8 | 19.0 | 10.1 | 0.12 | 0.038 | 0.0038 | 4.7 | unfavorable |
| Comparative Example 8 | R-28 | 90 | 60 | 105 | 60 | butyl acetate | 106.0 | 19.0 | 10.3 | 0.10 | 0.04 | 0.004 | 4.9 | unfavorable |
| Comparative Example 9 | R-28 | 90 | 60 | 105 | 60 | methyl amyl ketone | 107.9 | 22.0 | 11.2 | 0.10 | 0.04 | 0.0039 | 4.9 | unfavorable |

As is seen from Tables 3-1 to 3-3, the resist film provided from the composition for use in the pattern-forming method of the embodiment of the present invention is superior in etching resistance as compared with Comparative Examples 2 and 3. In addition, it was revealed that the resist pattern formed were superior in general characteristics of resists such as sensitivity and resolving ability.

According to the embodiment of the present invention, a trench pattern and/or hole pattern-forming method, and a radiation-sensitive resin composition can be provided which are suitable for use in liquid immersion lithography, leading to superior lithography characteristics such as sensitivity, cross-sectional shape and resolving ability.

Obviously, numerous modifications and variations of the present invention are possible in light of the above teachings. It is therefore to be understood that within the scope of the appended claims, the invention may be practiced otherwise than as specifically described herein.

The invention claimed is:
1. A pattern-forming method comprising:
coating a radiation-sensitive resin composition on a substrate to provide a resist film;
exposing the resist film; and
developing the exposed resist film,
wherein a developer solution used in developing the exposed resist film comprises no less than 80% by mass of an organic solvent, and
the radiation-sensitive resin composition comprises:
a radiation-sensitive acid generator; and
a first polymer that comprises a first structural unit, the first structural unit being represented by a formula (1) and having an acid-labile group and an alicyclic group, the acid-labile group being a group that substitutes for a hydrogen atom in a polar functional group, and that is dissociated by an action of an acid generated from the radiation-sensitive acid generator upon exposure, the alicyclic group being capable of avoiding dissociation from a molecular chain by an action of an acid,

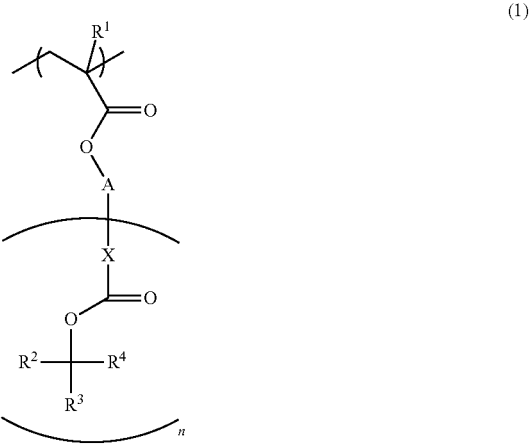

(1)

wherein, in the formula (1), $R^1$ represents a hydrogen atom, a methyl group or a trifluoromethyl group;

$R^2$ to $R^4$ each independently represent an alkyl group having 1 to 20 carbon atoms, or a cycloalkyl group having 3 to 20 carbon atoms, or $R^2$ represents an alkyl group having 1 to 20 carbon atoms, or a cycloalkyl group having 3 to 20 carbon atoms, and $R^3$ and $R^4$ taken together represent a ring together with the carbon atom to which $R^3$ and $R^4$ bond;

$CR^2R^3R^4$ is the acid-labile group;

A represents the alicyclic group having 3 to 20 carbon atoms and having a valency of (n+1), the alicyclic group represented by A being not the acid-labile group;

X represents a single bond, an alkanediyl group having 1 to 20 carbon atoms or an oxyalkanediyl group having 1 to 20 carbon atoms; and n is an integer of 1 to 3, wherein in a case where n is 2 or greater, a plurality of $R^2$s are each identical or different, a plurality of $R^3$s are each identical or different and a plurality of $R^4$s are each identical or different.

2. The pattern-forming method according to claim 1, wherein A in the above formula (1) is a group derived from adamantane or norbornane by removing 2 to 4 hydrogen atoms.

3. The pattern-forming method according to claim 1, wherein the radiation-sensitive resin composition further comprises a second polymer having a content of fluorine atoms higher than a content of fluorine atoms of the first polymer.

4. The pattern-forming method according to claim 1 further comprising etching the developed resist film.

5. The pattern-forming method according to claim 1, wherein the ring represented by $R^3$ and $R^4$ together with the carbon atom to which $R^3$ and $R^4$ bond is a divalent cycloalkane group which is unsubstituted or substituted with a linear, branched or cyclic alkyl group having 1 to 10 carbon atoms.

6. The pattern-forming method according to claim 5, wherein the divalent cycloalkane group is a cyclobutanediyl group, a cyclopentanediyl group, a cyclohexanediyl group, or a cycloheptanediyl group, wherein the cyclobutanediyl group, the cyclopentanediyl group, the cyclohexanediyl group, or the cycloheptanediyl group is unsubstituted or substituted with a linear, branched or cyclic alkyl group having 1 to 10 carbon atoms.

7. The pattern-forming method according to claim 1, wherein X in the formula (1) is a single bond, an oxyethylene group or an oxymethylene group.

8. The pattern-forming method according to claim 1, wherein an amount of the first structural unit in the first polymer is from 30 mol % to 60 mol % based on a total amount of structural units constituting the first polymer.

9. The pattern-forming method according to claim 1, wherein the first polymer further comprises a second structural unit represented by a formula (2),

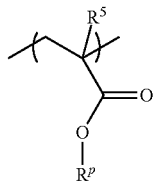

(2)

wherein $R^5$ represents a hydrogen atom, a methyl group or a trifluoromethyl group, and $R^p$ represents an acid-labile group.

10. The pattern-forming method according to claim 9, wherein an amount of the second structural unit in the first polymer is from 20 mol % to 60 mol % based on a total amount of structural units constituting the first polymer.

11. The pattern-forming method according to claim 1, wherein the first polymer further comprises a third structural unit having a lactone ring.

12. The pattern-forming method according to claim 11, wherein an amount of the third structural unit in the first polymer is from 30 mol % to 80 mol % based on a total amount of structural units constituting the first polymer.

* * * * *